(12) United States Patent
Choi et al.

(10) Patent No.: US 10,523,340 B2
(45) Date of Patent: Dec. 31, 2019

(54) TRANSMITTING DEVICE AND RECEIVING DEVICE PROVIDING RELAXED IMPEDANCE MATCHING

(71) Applicant: Samsung Electronics Co., Ltd., Suwon-si, Gyeonggi-do (KR)

(72) Inventors: Minsoo Choi, Pohang-si (KR); Byungsub Kim, Pohang-si (KR)

(73) Assignees: Samsung Electronics Co., Ltd., Gyeonggi-do (KR); Postech Academy-Industry Foundation, Gyeongsangbuk-do (KR)

( * ) Notice: Subject to any disclaimer, the term of this patent is extended or adjusted under 35 U.S.C. 154(b) by 0 days.

(21) Appl. No.: 16/235,053

(22) Filed: Dec. 28, 2018

(65) Prior Publication Data

US 2019/0372681 A1 Dec. 5, 2019

(30) Foreign Application Priority Data

May 31, 2018 (KR) ........................ 10-2018-0062901

(51) Int. Cl.
*H04B 15/00* (2006.01)
*H03H 11/28* (2006.01)
(Continued)

(52) U.S. Cl.
CPC ............. *H04B 15/00* (2013.01); *G01R 27/26* (2013.01); *H03H 11/28* (2013.01);
(Continued)

(58) Field of Classification Search
CPC .................................................. H04L 25/0278
See application file for complete search history.

(56) References Cited

U.S. PATENT DOCUMENTS 7,821,273 B2  10/2010  Van Bezooijen et al.
8,050,317 B2  11/2011  Okamura et al.
(Continued)

FOREIGN PATENT DOCUMENTS

KR         10-1273241       6/2013
KR      10-2017-0112280    10/2017

OTHER PUBLICATIONS

Minsoo Choi et al., "An FFe TX with 3.8x Eye Improvement by Automatic Impedance Adaptation for Universal Compatibility with Arbitrary Channel and RX Impedances", 2017 Symposium on VLSI Circuits Digest of Technical Papers, Jun. 5-8, 2017.

(Continued)

*Primary Examiner* — Kevin Kim
(74) *Attorney, Agent, or Firm* — Harness, Dickey and Pierce, P.L.C.

(57) ABSTRACT

Provided are a transmitting device connected to a receiving device via a channel and the receiving device connected to the transmitting device via a channel. The transmitting device connected to a receiving device includes: a transmitter connected to the channel via an output node and configured to transmit, via the channel, a transmission signal to the receiving device, the transmitter having a transmission impedance associated therewith that is variable; and a monitoring device configured to detect a channel impedance of the channel and a receiving impedance of the receiving device by monitoring a voltage level of the output node, the monitoring device configured to set the transmission impedance based on the channel impedance and the receiving impedance.

19 Claims, 18 Drawing Sheets

(51) Int. Cl.
*G01R 27/26* (2006.01)
*H03F 3/45* (2006.01)

(52) U.S. Cl.
CPC ...... *H03F 3/45188* (2013.01); *H03F 3/45192* (2013.01); *H03F 2200/375* (2013.01); *H03F 2200/387* (2013.01); *H03F 2203/45044* (2013.01)

(56) References Cited

U.S. PATENT DOCUMENTS

| | | |
|---|---|---|
| 8,208,529 B2 | 6/2012 | Yang et al. |
| 8,306,496 B2 | 11/2012 | Shoji et al. |
| 8,965,706 B2 | 2/2015 | Ji |
| 9,210,008 B2 | 12/2015 | Rane |
| 9,548,734 B1 * | 1/2017 | Song ............. H03K 19/017545 |
| 2014/0211834 A1 | 7/2014 | Park et al. |
| 2016/0072650 A1 * | 3/2016 | Mobin ................ H04L 25/0278 |
| | | 375/219 |
| 2017/0272105 A1 | 9/2017 | Wallis |
| 2017/0288717 A1 | 10/2017 | Lee et al. |

OTHER PUBLICATIONS

Minsoo Choi et al., "An FFE Transmitter Which Automatically and Adaptively Relaxes Impedance Matching" IEEE Journal of Solid-State Circuits, vol. 53, Issue 6, pp. 1780-1792, Jun. 2018.

* cited by examiner

Transfer Function $$\frac{V_L(\omega)}{I_S(\omega)} = \frac{R_{TX} Z_0}{R_{TX} + Z_0} 2 e^{-L\gamma(\omega)} \frac{R_{RX}}{Z_0 + R_{RX}} \frac{1}{1 - \Gamma_{TX} \Gamma_{RX} e^{-2L\gamma(\omega)}}$$

Relaxed Impedance Matching Constraint $$|\Gamma_{TX} \Gamma_{RX} e^{-2L\gamma(\omega)}| \ll 1$$

| Impedance matching | Relaxed Impedance Matching |
|---|---|
| $R_{TX} = R_{RX} = Z_0$ | $R_{TX} \neq Z_0, R_{RX} \neq Z_0$ |
| $\dfrac{V_L(\omega)}{I_S(\omega)} = \dfrac{Z_0}{2} R_{TX} e^{-L\gamma(\omega)}$ | $\dfrac{V_L(\omega)}{I_S(\omega)} \approx \dfrac{R_{TX} Z_0}{R_{RX}+Z_0} 2 e^{-L\gamma(\omega)} \dfrac{R_{RX}}{Z_0+R_{RX}}$ |

— 41 ($R_{TX}$ = R1, $I_a$ = I1)
--- 42 ($R_{TX}$ = R2, $I_a$ = I1)
------ 43 ($R_{TX}$ = R2, $I_a$ = I2)

TRANSMITTING DEVICE AND RECEIVING DEVICE PROVIDING RELAXED IMPEDANCE MATCHING

CROSS-REFERENCE TO RELATED APPLICATION

This application claims the benefit of Korean Patent Application No. 10-2018-0062901, filed on May 31, 2018, in the Korean Intellectual Property Office, the disclosure of which is incorporated herein in its entirety by reference.

BACKGROUND

Example embodiments of the inventive concepts relate to an integrated circuit device. For example, at least some example embodiments relate to an integrated circuit device including a transmitting device and/or a receiving device providing adaptively relaxed impedance matching.

In high-speed interconnect, channels of various impedance and transmitters/receivers of various impedances are used. For example, a backplane channel may be configured to have various impedance values according to a standard. For example, a channel of about 40Ω to about 50Ω, and transmitters/receivers of about 25Ω to about 60Ω may be used in a high speed memory interface such as double data rate (DDR) fourth-generation (DDR4) or graphics DDR version 5 (GDDR5). In addition, various types of cables, for example, coaxial cables and biaxial cables, of about 30δ to about 100Ω, are used.

Various impedance standards of transmitters, channels, and receivers inconvenience a user in terms of compatibility. Particularly, when devices of different impedance standards are connected to each other, impedance mismatching affects signal integrity, and as a result, causes communication errors.

SUMMARY

Example embodiments of the inventive concepts provide an integrated circuit device including a transmitting device and/or a receiving device providing adaptively relaxed impedance matching.

According to an example embodiment of the inventive concepts, there is provided a transmitting device configured to connect to a receiving device via a channel. In some example embodiments, the transmitting device may include a transmitter connected to the channel via an output node, the transmitter configured to transmit, via the channel, a transmission signal to the receiving device, the transmitter having a transmission impedance associated therewith that is variable; and a monitoring device configured to detect a channel impedance of the channel and a receiving impedance of the receiving device by monitoring a voltage level of the output node, and to set the transmission impedance based on the channel impedance and the receiving impedance.

According to another example embodiment of the inventive concepts, there is provided a receiving device configured to connect to a transmitting device via a channel. In some example embodiments, the receiving device includes a receiver connected to the channel via an input node, the receiver configured to receive, via the channel, a receiving signal from the transmitting device, the receiver having a receiving impedance associated therewith that is variable; and a monitoring device configured to detect a channel impedance of the channel and a transmission impedance of the transmitting device by monitoring a voltage level of the input node, and to set the receiving impedance based on the channel impedance and the transmission impedance.

According to another example embodiment of the inventive concepts, there is provided a transmitter configured to connect to a receiver via a channel. In some example embodiments, the transmitter may include a transmitting driver having a transmission impedance associated therewith that is adaptive to a channel impedance of the channel and a receiving impedance of the receiver; and an on-chip monitor configured to set the transmission impedance based on the channel impedance, the receiving impedance and a relaxed impedance matching constraint, wherein the on-chip monitor and the transmitting driver are integrated on a same chip.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
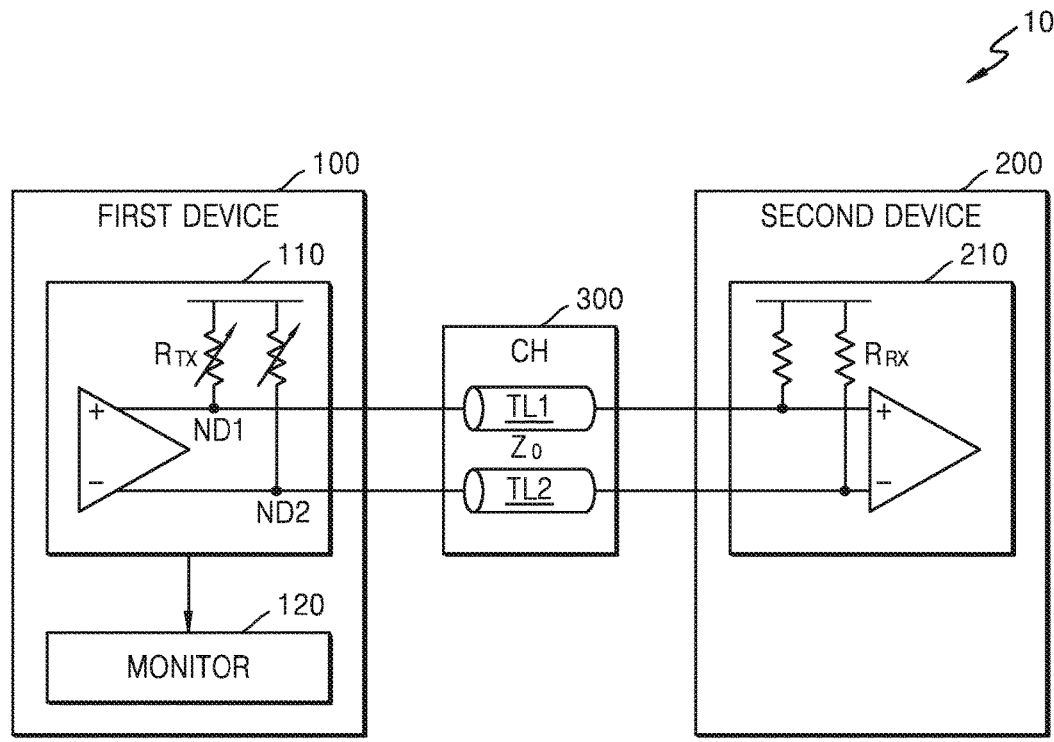
FIG. 1 illustrates a system according to an example embodiment of the inventive concepts.

Hereinafter, example embodiments of the inventive concepts swill be described in detail with reference to the accompanying drawings. Identical reference numerals are used for the same constituent elements in the drawings, and a duplicate description thereof is omitted.

FIG. 1 illustrates a system 10 according to an example embodiment.

Referring to FIG. 1, the system 10 may include a first device 100, a second device 200, and a channel 300. The first device 100 and the second device 200 may be connected to each other via the channel 300. For example, the first device 100 may operate as a transmitting device and the second device 200 may operate as a receiving device, and thus, the system 10 may perform uni-directional communication. However, the inventive concepts are not limited thereto. The first device 100 and the second device 200 may perform both a transmission operation and a receiving operation, respectively, so that the system 10 may perform bi-directional communication.

The first device 100 may include a transmitting block (or, alternatively, a transmitter) 110 and a monitor (or, alternatively, a monitoring device) 120. The transmitting block 110 may be connected to the channel 300 via an output node to transmit a transmission signal to the second device 200. In an example embodiment, the transmitting block 110 may include a first output node ND1 and a second output node ND2 and may transmit a differential transmission signal to the second device 200 via the first output node ND1 and the second output node ND2. However, the inventive concepts are not limited thereto, and the transmitting block 110 may transmit a single-ended transmission signal via a single output node.

The channel 300 may have channel impedance $Z_0$. In an example embodiment, the channel 300 may include a first transmission line TL1 and a second transmission line TL2. The first transmission line TL1 may be connected to the first output node ND1, and the second transmission line TL2 may be connected to the second output node ND2. Accordingly, the first device 100 may transmit the differential transmission signal to the second device 200. However, the inventive concepts are not limited thereto. The channel 300 may include a single transmission line, and the first device 100 may transmit a single-ended transmission signal to the second device 200.

The second device 200 may include a receiving block (or, alternatively, a receiver) 210, and the receiving block 210 may have receiving impedance $R_{RX}$. The first device 100 may be connected to the channel 300, which is one of various types of channels, and may be connected to the second device 200, which is one of various receiving devices via the channel 300. Accordingly, the channel impedance $Z_0$ and the receiving impedance $R_{RX}$ in the system 10 may be variously changed. When the transmitting block 110 has fixed transmission impedance, impedance mismatching may affect signal integrity of the transmission signals and as a result, may cause errors in communication between the first device 100 and the second device 200.

According to an example embodiment, the transmitting block 110 may have transmission impedance $R_{TX}$ that is adaptively configured to the channel impedance $Z_0$ and the receiving impedance $R_{RX}$. Since the transmission impedance $R_{TX}$ and the receiving impedance $R_{RX}$ are usually resistance components, the transmission impedance $R_{TX}$ and the receiving impedance $R_{RX}$ are referred to herein as substantially the same as a transmission resistance and a receiving resistance, respectively.

In a training mode for configuring the transmission impedance $R_{TX}$, the monitor 120 may detect the channel impedance $Z_0$ and the receiving impedance $R_{RX}$ by monitoring a first voltage level of the first output node ND1 and a second voltage level of the second output node ND2, and the transmission impedance $R_{TX}$ may be configured based on the detected channel impedance $Z_0$ and the receiving impedance $R_{RX}$. When configuration of the transmission impedance $R_{TX}$ is completed, in a normal mode, the first device 100 may provide normal data signals via the first and second output nodes ND1 and ND2.

In an example embodiment, the monitor 120 may calculate the transmission impedance $R_{TX}$ according to relaxed impedance matching constraints, which allows a voltage level of the transmission signal arriving at the second device 200 to be increased within a range in which reflection of the transmission signal in the second device 200 is not increased, and the monitor 120 may configure the transmission impedance $R_{TX}$ of the transmitting block 110 according to the calculated transmission impedance $R_{TX}$. The relaxed impedance matching constraints are described in detail with reference to FIG. 2.

In an example embodiment, in the first device 100, the transmitting block 110 and the monitor 120 may be implemented on one same chip and thus, the monitor 120 may be referred to as an on-chip monitor. For example, the monitor 120 may be a time domain reflectometer (TDR) monitor. In an example embodiment, the first device 100 may include a plurality of transmitting blocks. In this case, the monitor 120 may be connected to the plurality of transmitting blocks 110 in common, and the plurality of transmitting blocks 110 may share the monitor 120. In addition, the plurality of transmitting blocks 110 may transmit a plurality of transmission signals to the second device 200 via a plurality of transmission lines, respectively.

Figure 2:
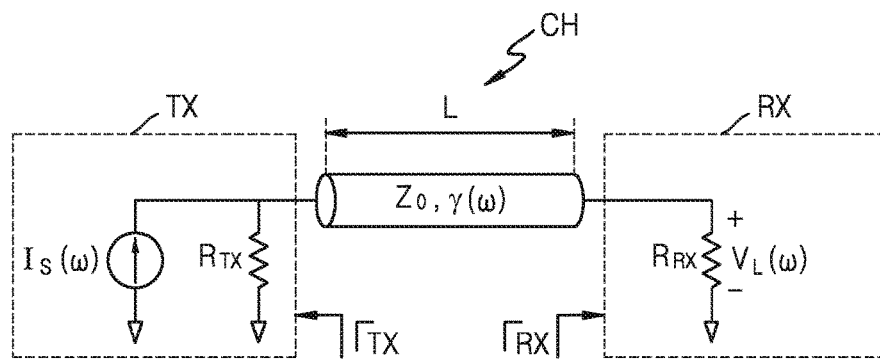
FIG. 2 illustrates an interconnect model for explaining a transfer function for the system of FIG. 1.

FIG. 2 illustrates an interconnect model for explaining a transfer function for the system 10 of FIG. 1.

Referring to FIG. 2, a transmitter TX may be connected to a receiver RX via the channel CH. The transmitter TX may correspond to a modeling result of the first device 100 of FIG. 1 and the receiver RX may correspond to a modeling result of the second device 200 of FIG. 1. Hereinafter, it is assumed that impedance $Z_{TX}(\omega)$ of the transmitter TX, impedance $Z_{RX}(\omega)$ of the receiver RX, and impedance $Z_c(\omega)$ of the channel CH are all resistance components, and thus, it will be denoted as $Z_{TX}(\omega)=R_{TX}$, $Z_{RX}(\omega)=R_{RX}$, and $Z_c(\omega)=Z_0$, where $\omega$ denotes an angular frequency. Here, the transfer function may be derived as shown in Formula 1 below.

$$\frac{V_L(\omega)}{I_s(\omega)} = \frac{R_{TX} \cdot Z_0}{R_{TX}+Z_0} \cdot 2e^{-L\gamma(\omega)} \cdot \frac{R_{RX}}{Z_0+R_{RX}} \cdot \frac{1}{1-\Gamma_{TX}\Gamma_{RX}e^{-2L\gamma(\omega)}} \quad \text{[Formula 1]}$$

Here, $R_{TX}$ may be the transmission impedance of the transmitter TX, $R_{RX}$ may be the receiving impedance of the receiver RX, and $Z_0$ may be the channel impedance of the channel CH. In addition, $\Gamma_{TX}$ may be a reflection coefficient of the transmitter TX, $\Gamma_{RX}$ may be the reflection coefficient of the receiver RX, and L is a length of the channel CH. The reflection coefficient $\Gamma_{TX}$ of the transmitter TX and the reflection coefficient $\Gamma_{RX}$ of the receiver RX may be expressed by Formula 2 and Formula 3, respectively. Here, $V_{L(\omega)}$ denotes a voltage across the receiving impedance of the receiver RX, $I_{S(\omega)}$ denotes current provided by the transmitter TX, and $\gamma(\omega)$ denotes a reflection coefficient of the channel CH.

$$\Gamma_{TX}=(R_{TX}-Z_0)/(R_{TX}+Z_0) \qquad \text{[Formula 2]}$$

$$\Gamma_{RX}=(R_{RX}-Z_0)/(R_{RX}+Z_0) \qquad \text{[Formula 3]}$$

The relaxed impedance matching constraint according to an example embodiment may be expressed by Formula 4 below.

$$|\Gamma_{TX}\Gamma_{RX}e^{-2L\gamma(\omega)}|<<1 \qquad \text{[Formula 4]}$$

In an example embodiment, the relaxed impedance matching constraint may configure $|\Gamma_{TX}\Gamma_{RX}e^{-2L\gamma(\omega)}|$ to take a value of K, which is a number between 0 and 1. For example, when K is about 0.03, a range of the transmission impedance $R_{TX}$ may be determined such that $|\Gamma_{TX}\Gamma_{RX}e^{-2L\gamma(\omega)}|$ is equal to or less than about 0.03. On the other hand, when Formula 4 is satisfied, Formula 1 may be approximated by Formula 5 below.

$$\frac{V_L(\omega)}{I_s(\omega)} = \frac{R_{TX}\cdot Z_0}{R_{TX}+Z_0}\cdot 2e^{-L\gamma(\omega)}\cdot\frac{R_{RX}}{Z_0+R_{RX}} \qquad \text{[Formula 5]}$$

Figures 3A, 3B:
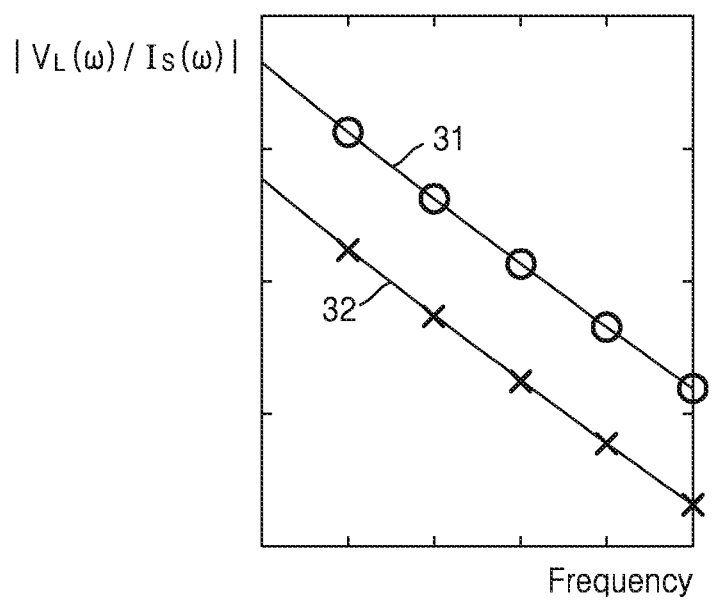
FIG. 3A shows transfer a transfer function under a relaxed impedance matching constraint according to an example embodiment of the inventive concepts and a transfer function under an impedance matching constraint.
FIG. 3B shows graphs of magnitudes of a transfer function at various transmission impedance constraints and various receiving impedance constraints according to an example embodiment of the inventive concepts.

FIG. 3A shows a transfer function under the relaxed impedance matching constraint according to an example embodiment and a transfer function under an impedance matching constraint.

Referring to FIGS. 2 and 3A, when the impedance matching constraint is satisfied, the transmission impedance $R_{TX}$ may be equal to the reception impedance $R_{RX}$ and the channel impedance $Z_0$ (that is, $R_{TX}=R_{RX}=Z_0$). In this case, Formula 5 may be expressed as Formula 6 below.

$$\frac{V_L(\omega)}{I_s(\omega)} = \frac{Z_0}{2}\cdot R_{TX}e^{-L\gamma(\omega)} \qquad \text{[Formula 6]}$$

On the other hand, when the relaxed impedance matching constraint (that is, Formula 4) is satisfied, the transmission impedance $R_{TX}$ may not be equal to the channel impedance $Z_0$ and the reception impedance $R_{RX}$ may not be equal to the channel impedance $Z_0$ (that is, $R_{TX}\neq Z_0$, $R_{RX}\neq Z_0$). In this case, the transfer function may be the same as that in Formula 5.

FIG. 3B shows graphs of magnitudes of the transfer function at various transmission impedance constraints and various receiving impedance constraints according to an example embodiment.

Referring to FIGS. 2 through 3B, the horizontal axis may represent a frequency and the vertical axis may represent a magnitude of the transfer function. A first graph 31 may represent the magnitude of the transfer function according to the frequency when the relaxed impedance matching constraint (that is, Formula 4) is satisfied, and a second graph 32 may represent the magnitude of the transfer function according to the frequency when the impedance matching constraint is satisfied. Since Formula 5 and Formula 6 both include $e^{-L\gamma(\omega)}$, shapes of frequency spectra of the first and second graphs 31 and 32 may be almost the same. Thus, both the case where the relaxed impedance matching constraint is satisfied and the case where the impedance matching condition is satisfied may have the same influence effect of signal reflection by the receiver RX in a time domain.

On the other hand, the magnitude of the transfer function of the first graph 31 may be greater than that of the transfer function of the second graph 32 at the same frequency. In this manner, a magnitude of the transmission signal transmitted to the receiver RX, in the case when the relaxed impedance matching constraint is satisfied, may be greater than that of the transmission signal transmitted to the receiver RX in the case when the impedance matching constraint is satisfied. Thus, the voltage level of the transmission signal arriving at the receiver RX may be increased within a range in which the reflection of the transmission signal at the receiver RX is not increased, by configuring the transmission impedance $R_{TX}$ according to the relaxed impedance matching constraint.

Figure 4A:
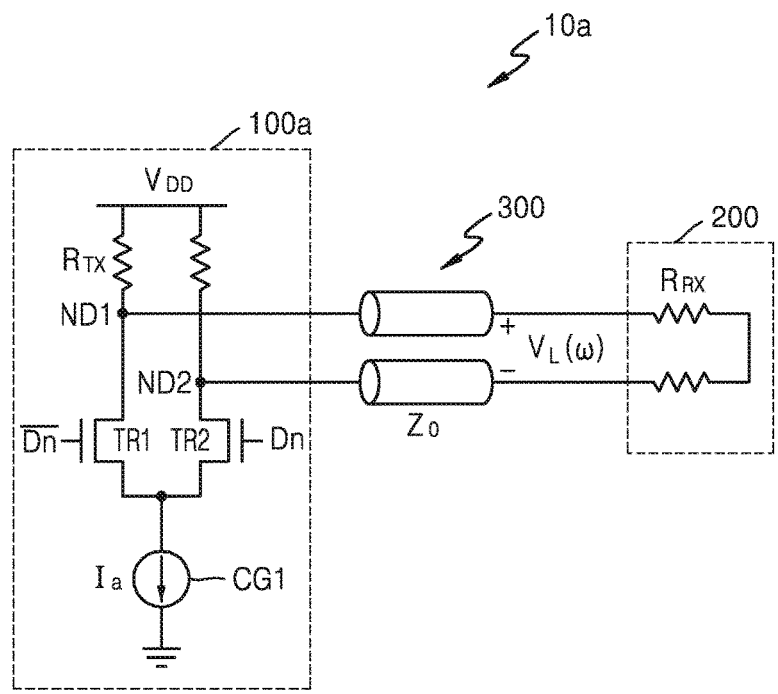
FIG. 4A schematically illustrates a system according to an example embodiment of the inventive concepts.

FIG. 4A schematically illustrates a system 10a according to an example embodiment.

Referring to FIG. 4A, the system 10a may include a first device 100a, the second device 200, and the channel 300. The first device 100a may be implemented in a current mode logic (CML) structure. The first device 100a may include a first current generator (CG) CG1 for generating a first current $I_a$. The first device 100a may further include a first transistor TR1 including a gate to which a negative data signal $\overline{D_n}$ is applied and connected to the first output node ND1, and a second transistor TR2 including a gate to which a positive data signal $D_n$ is applied and connected to the second output node ND2. At this time, the largest value among the transmission impedances satisfying the relaxed impedance matching constraint may be a good impedance in terms of performance and power efficiency of the first device 100a.

However, the inventive concepts are not limited thereto, and in some example embodiments, a transmitting device may be implemented in a voltage mode logic structure such as a source series terminated (SST) driver. At this time, the lowest value among the transmission impedances satisfying the relaxed impedance matching constraint may be adequate impedance in terms of performance and power efficiency of a transmitting device.

For example, when the transmitting device is implemented in the voltage mode logic architecture, the transmitting device may include a p-channel metal-oxide-semiconductor (PMOS) transistor including a gate connected between a power supply voltage terminal and the output node and to which a data signal is applied, an n-channel metal-oxide-semiconductor (NMOS) transistor including a gate connected between the output node and a ground voltage terminal and to which the data signal is applied, and a variable transmission resistor connected to the output node. Here, the resistance value of the variable transmission resistor may be configured to be the lowest value in a range satisfying Formula 4.

Figure 4B:
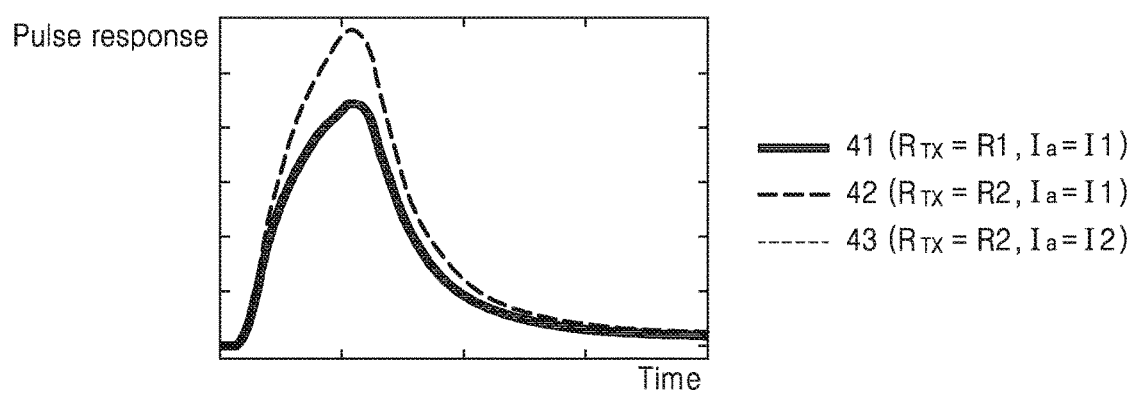
FIG. 4B is a graph of pulse response at various transmission impedance and current conditions according to an example embodiment of the inventive concepts.

FIG. 4B is a graph of pulse response at various transmission impedance and current conditions according to an example embodiment;

Referring to FIG. 4B, the horizontal axis may represent time and the vertical axis may represent pulse response. A first impedance R1 may be the minimum value of the transmission impedance $R_{TX}$ satisfying the relaxed impedance matching constraint and a second impedance R2 may be the maximum value of the transmission impedance $R_{TX}$ satisfying the relaxed impedance matching constraint. A first curve 41 may represent the case in which the transmission impedance $R_{TX}$ is a first impedance R1 and the first current $I_a$ is a first current value I1, a second curve 42 may represent the case in which the transmission impedance $R_{TX}$ is a second impedance R2 greater than the first impedance R1, and a third curve 43 may represent the case in which the transmission impedance $R_{TX}$ is a second impedance R2 and the first current $I_a$ is a second current value I2 less than the first current value I1. For example, the first impedance R1 may be about 38Ω and the second impedance R2 may be about 65Ω.

Comparing the first and second curves 41 and 42, it may be understood that, when the first current $I_a$ is the same, the pulse response indicates a higher voltage level as the transmission impedance $R_{TX}$ increases. Comparing the first and third curves 41 and 43, it may be understood that an amount of the first current $I_a$ required to obtain the same pulse response decreases as the transmission impedance $R_{TX}$ increases. In this manner, when the transmission impedance $R_{TX}$ is configured to the second impedance R2, which is the maximum value satisfying Formula 4, a magnitude of a signal transmitted to the second device 200 may be increased with low power consumption. Thus, a power efficiency may be improved by configuring the transmission impedance $R_{TX}$ according to the relaxed impedance matching constraint.

Figure 5:
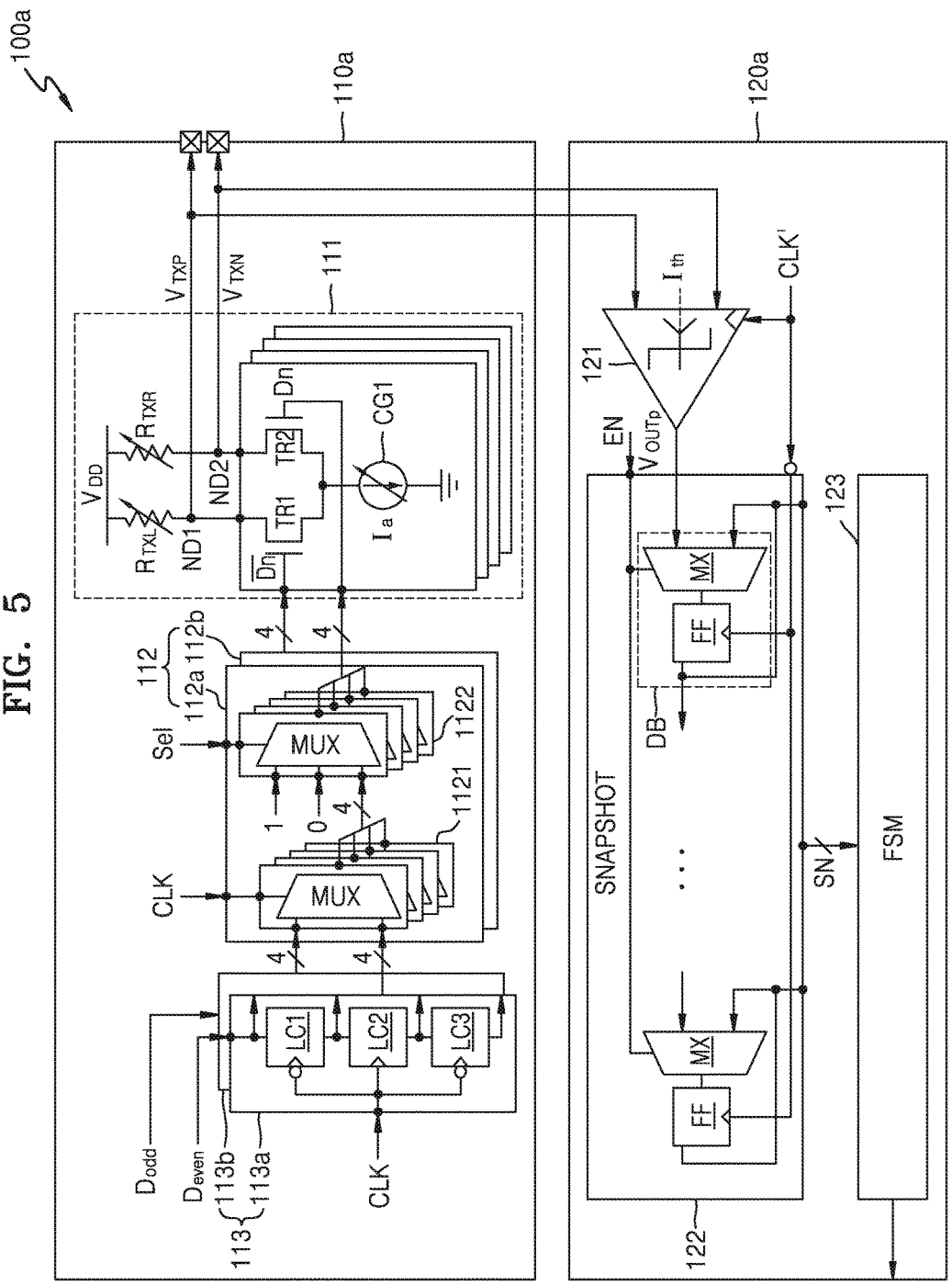
FIG. 5 is a circuit diagram illustrating in detail a first device according to an example embodiment of the inventive concepts.

FIG. 5 is a circuit diagram illustrating in detail a first device 100a according to an example embodiment.

Referring to FIG. 5, the first device 100a may include a transmission block 110a and a monitor 120a. The first device 100a may correspond to the first device 100a illustrated in FIG. 4A. The first device 100a may correspond to an example of the first device 100 in FIG. 1, and the transmission block 110a and the monitor 120a may correspond to examples of the transmitting block 110 and the monitor 120 in FIG. 1, respectively. Descriptions given above with reference to FIGS. 1 through 4B may also be applied to the present example embodiment, and repeated descriptions are omitted. For example, the first device 100a may be implemented as a 4-tap transmitter, as illustrated in FIG. 5. However, the inventive concepts str not limited thereto, and a tap coefficient of the first device 100a may be variously changed according to an example embodiment.

The transmission block 110a may include a driver 111, a data selector 112, and a data buffer 113. The data buffer 113 may include a first buffer 113a for buffering even data $D_{even}$ and a second buffer 113b for buffering odd data $D_{odd}$. The first buffer 113a may include first through third latches LC1 through LC3. The first latch LC1 may delay the even data $D_{even}$ according to an inverted signal of a clock signal CLK. The second latch LC2 may delay an output of the first latch LC1 according to the clock signal CLK. The third latch LC3 may delay an output of the second latch LC2 according to the inverted signal of the clock signal CLK. The second buffer 113b may be implemented similarly to the first buffer 113a.

The data selector 112 may include a first data selector 112a generating a positive data signal $D_n$ and a second data selector 112b generating a negative data signal $\overline{D_n}$. The first data selector 112a may include first multiplexers (MUXs) 1121 and second MUXs 1122. The first MUX 1121 may selectively output the even data $D_{even}$ and the odd data $D_{odd}$ according to the clock signal CLK and may operate as a data serializer. The second MUX 1122 may select 1, 0, or the output of the first MUX 1121 according to a selection signal Sel. The second data selector 112b may be implemented similarly to the first data selector 112a.

The driver 111 may include a first variable transmission resistor $R_{TXL}$ connected between a power voltage terminal $V_{DD}$ and the first output node ND1, a second variable transmission resistor $R_{TXR}$ connected between the power voltage terminal $V_{DD}$ and the second output node ND2, a first transistor TR1 including a gate to which the negative data signal $\overline{D_n}$ is applied and connected to the first output node ND1, a second transistor TR2 including a gate to which the positive data signal $D_n$ is applied and connected to the second output node ND2, and the first current generator CG1 connected to the first and second transistors TR1 and TR2. The first current generator CG1 may provide the first current $I_a$ to the first and second transistors TR1 and TR2 in the training mode for detecting the transmission impedance $R_{TX}$.

The monitor 120a may include a slicer 121, a snapshot block (SNAPSHOT) 122, and a finite state machine (FSM) 123. The slicer 121 may receive a first voltage level $V_{TXP}$ of the first output node ND1 and a second voltage level $V_{TXN}$ of the second output node ND2, and may output a digital voltage $V_{OUTp}$ by converting the first voltage level $V_{TXP}$ and the second voltage level $V_{TXN}$ of the second output node ND2 into digital bits. The slicer 121 may receive a delayed clock signal CLK' and operate according to the delayed clock signal CLK'. In an example embodiment, the delayed clock signal CLK' and the clock signal CLK may be signals having substantially the same phase. The slicer 121 may further receive an adjustment current $I_{th}$ and correct an offset of the slicer 121 based on the adjustment current Ith.

The SNAPSHOT 122 may receive the digital voltage $V_{OUTp}$ from the slicer 121 and generate a snapshot signal SN of m bits from the digital voltage $V_{OUTp}$, wherein m is an integer equal to or greater than 2. The SNAPSHOT 122 may include m delay blocks DB, and each delay block DB may include a multiplexer MX and a flip-flop FF. The flip-flop FF may receive the delayed clock signal CKL'. In addition, the SNAPSHOT 122 may further receive an enable signal EN and when the enable signal EN is activated, may generate the snapshot signal SN of m bits. For example, when the enable signal EN is activated, that is, logic high, an output of the slicer 121 may be sequentially provided to the m delay blocks DB, and accordingly, the snapshot signal SN of m bits may be generated. For example, when the enable signal EN is inactivated, that is, logic low, each delay block DB may hold data and the data held in each delay block DB may not be transmitted to the next delay block DB.

The FSM 123 may detect the channel impedance $Z_0$ and the receiving impedance $R_{RX}$ based on the snapshot signal SN of m bits and may calculate transmission impedance $R_{TX}$ based on the detected channel impedance $Z_0$ and receiving impedance $R_{RX}$. In addition, the FSM 123 may configure resistance values of the first and second variable transmission resistors $R_{TXL}$ and $R_{TXR}$ according to the calculated transmission impedance $R_{TX}$.

Figure 6:
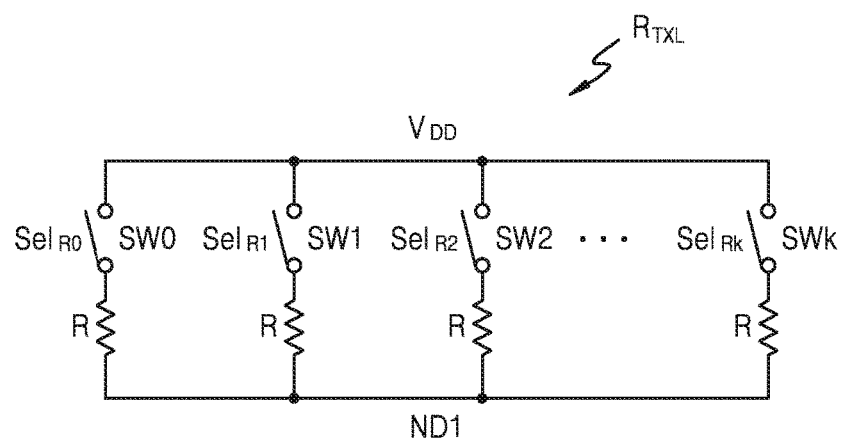
FIG. 6 is a circuit diagram illustrating a first variable transmission resistor according to an example embodiment of the inventive concepts.

FIG. 6 is a circuit diagram illustrating the first variable transmission resistor $R_{TXL}$ according to an example embodiment.

Referring to FIG. 6, the first variable transmission resistor $R_{TXL}$ may include a plurality of resistors R connected in common to the first output node ND1. The first variable transmission resistor $R_{TXL}$ may further include zeroth through $k^{th}$ switches SW0 through SWk connected in common to the power voltage terminal VDD and in series to each other, wherein k is an arbitrary natural number. The second variable transmission resistance $R_{TXR}$ may be implemented substantially similar to the first variable transmission resistance $R_{TXL}$.

The zeroth through $k^{th}$ switches SW0 through SWk may be turned on/off in response to corresponding zeroth through $k^{th}$ selection signals $Sel_{R0}$ through $Sel_{Rk}$, respectively, so that the resistance value of the first variable transmission resistor $R_{TXL}$ may be determined. In an example embodiment, the FSM 123 may detect the channel impedance $Z_0$ and the receiving impedance $R_{RX}$, calculate the transmission impedance $R_{TX}$ based on the detected channel impedance $Z_0$ and receiving impedance $R_{RX}$, and generate the zeroth through $k^{th}$ selection signals $Sel_{R0}$ through $Sel_{Rk}$ according to the calculated transmission impedance $R_{TX}$.

Figure 7A:
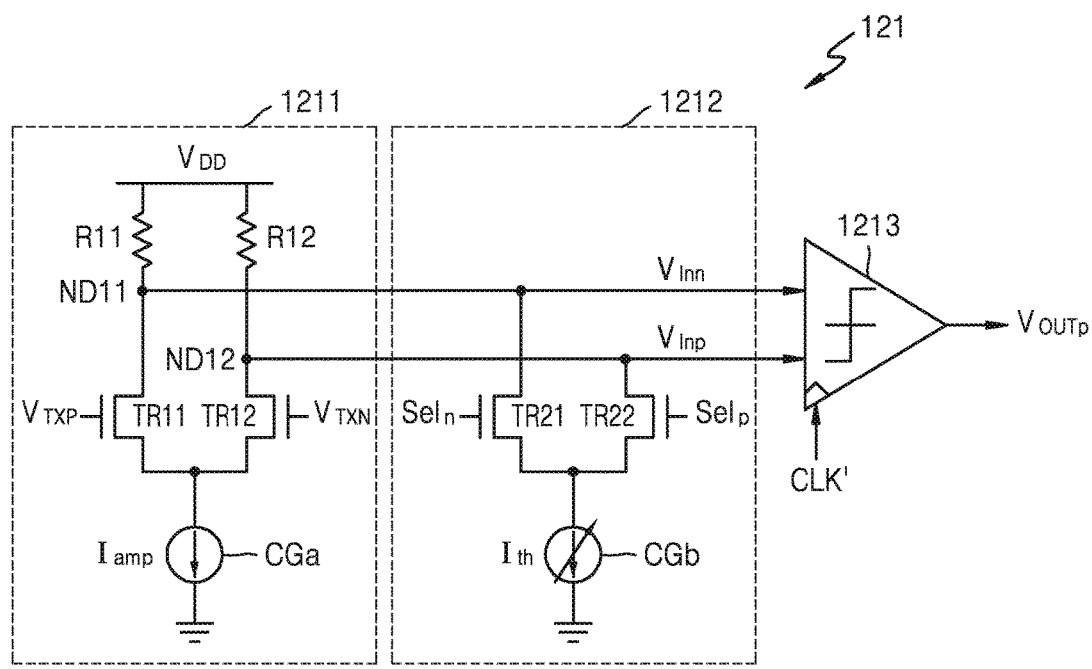
FIG. 7A is a circuit diagram illustrating a slicer according to an example embodiment of the inventive concepts.

FIG. 7A is a circuit diagram illustrating the slicer 121 according to an example embodiment.

Referring to FIG. 7A, the slicer 121 may include a pre-amplifier 1211, an offset corrector 1212, and a comparator 1213. The pre-amplifier 1211 may include a first resistor R11 and a second resistor R12, a first transistor TR11 and a second transistor TR12, and an amplifier current generator CGa. The first resistor R11 may be connected between the power voltage terminal $V_{DD}$ and a first node ND11, and the second resistor R12 may be connected between the power voltage terminal $V_{DD}$ and a second node ND12.

The first transistor TR11 may be connected in series to the first resistor R11 and may include a gate to which the first voltage level $V_{TXP}$ of the first output node ND1 is applied. The second transistor TR12 may be connected in series to the second resistor R12 and may include a gate to which the second voltage level $V_{TXN}$ of the second output node ND2 is applied. The amplifier current generator CGa may be connected between the first and second transistors TR11 and TR12 and the ground voltage terminal and may provide an amplifier current $I_{amp}$ to the first and second transistors TR11 and TR12. A first input voltage $V_{Inn}$ of the first node ND11 may be determined according to the first voltage level $V_{TXP}$ of the first output node ND1, and a second input voltage $V_{Inp}$ of the second node ND12 may be determined according to the second voltage level $V_{TXN}$ of the second output node ND2.

Figure 7B:
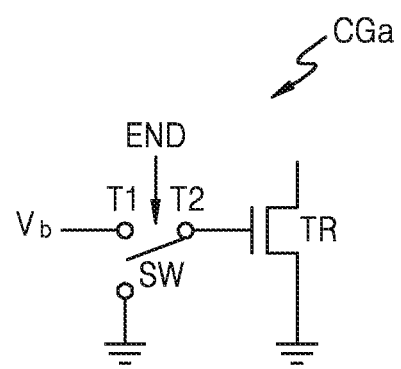
FIG. 7B is a circuit diagram illustrating an amplifier current generator illustrated in FIG. 7A.

FIG. 7B is a circuit diagram illustrating the amplifier current generator CGa in FIG. 7A.

Referring to FIG. 7B, the amplifier current generator CGa may include a transistor TR and a switch SW. The transistor TR may be arranged between the first and second transistors TR11 and TR12 and the ground voltage terminal. A first terminal T1 of the switch SW may be connected to a bias voltage terminal Vb, and a second terminal T2 thereof may be connected to a gate of the transistor TR. The switch SW may be turned on/off according to an end signal END and accordingly, may control a voltage applied to the gate of the transistor TR.

In an example embodiment, when the end signal END is activated, the switch SW may be connected to the ground voltage terminal, and the transistor TR may be turned off. On the other hand, when the end signal END is inactivated, the switch SW may be connected to the bias voltage terminal Vb and the transistor TR may be turned on. The end signal END may be activated when configuration of the transmission impedance $R_{TX}$ is completed. In other words, the end signal END may be deactivated in the training mode and be activated in a normal mode. Accordingly, when the training mode is terminated, the amplifier current generator CGa may not additionally consume power.

Referring again to FIG. 7A, the offset corrector 1212 may include a third transistor TR21 and a fourth transistor TR22, and an adjustment current generator CGb. The third transistor TR21 may be connected to the first node ND11 and may include a gate to which a first selection voltage $Sel_n$ is applied. The fourth transistor TR22 may be connected to the second node ND12 and may include a gate to which the second selection voltage $Sel_p$ is applied. The adjustment current generator CGb may be connected between the third and fourth transistors TR21 and TR22 and the ground voltage terminal and may provide the adjustment current $I_{th}$ to the third and fourth transistors TR21 and TR22. The adjustment current generator CGb may vary the adjustment current $I_{th}$ so that the first input voltage $V_{Inn}$ and the second input voltage $V_{Inp}$ have the same level. The adjustment current generator CGb may be implemented similarly to the amplifier current generator CGa and may be implemented, for example, as illustrated in FIG. 7B.

The comparator 1213 may generate the digital voltage $V_{OUTp}$ by comparing the first input voltage $V_{Inn}$ with the second input voltage $V_{Inp}$ based on the delayed clock signal CLK'. Detailed configuration and operation of the comparator 1213 are described with reference to FIG. 8.

Figure 8:
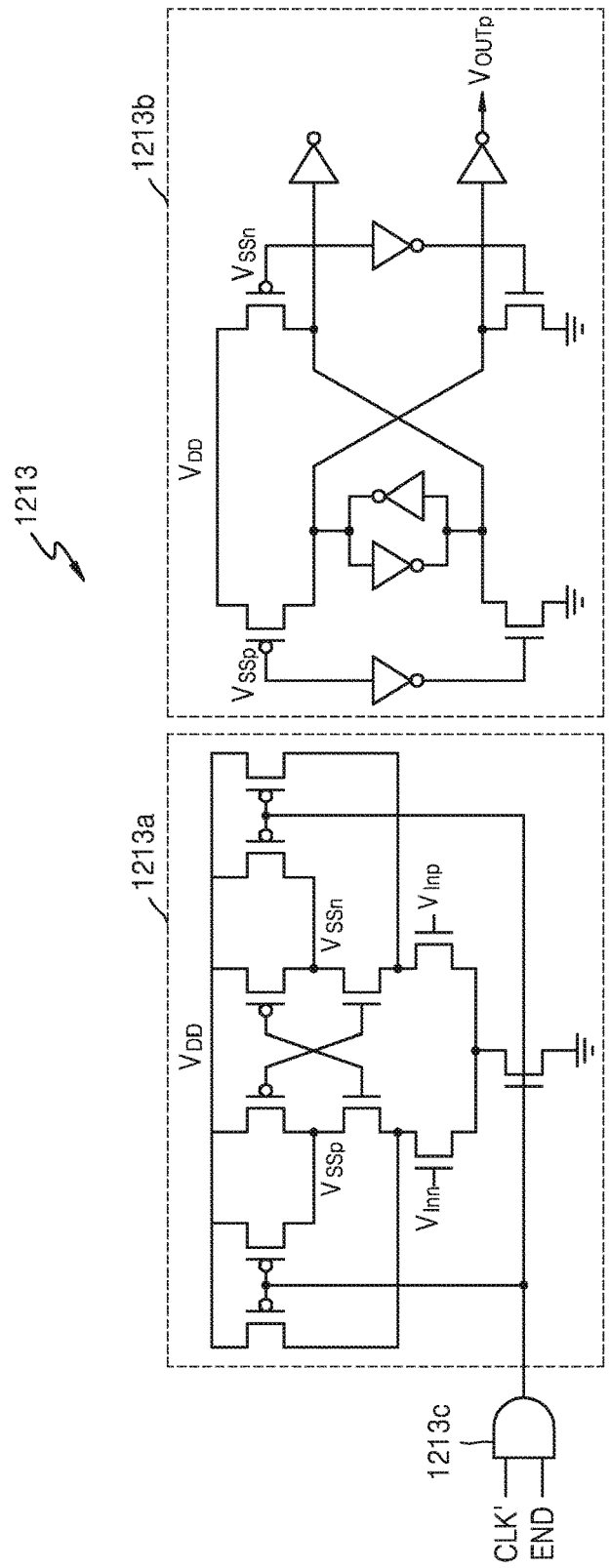
FIG. 8 is a circuit diagram illustrating a comparator in FIG. 7A.

FIG. 8 is a circuit diagram illustrating the comparator 1213 in FIG. 7A.

Referring to FIG. 8, the comparator 1213 may include a sense amplifier 1213a and a latch unit 1213b. In addition, the comparator 1213 may further include a clock gating circuit 1213c. The sense amplifier 1213a may generate a first sensing voltage $V_{SSp}$ and a second sensing voltage $V_{SSn}$ from the first input voltage $V_{Inp}$ and the second input voltage $V_{Inp}$, respectively. The latch unit 1213b may generate the digital voltage $V_{OUTp}$ from the first sensing voltage $V_{SSp}$ and the second sensing voltage $V_{SSn}$. The clock gating circuit 1213c may be implemented with an AND gate receiving the delayed clock signal CLK' and the end signal END. In an example embodiment, when the end signal END is activated, the delay clock signal CLK' may not be provided to the sense amplifier 1213a, and accordingly, the sense amplifier 1213a may be turned off. Accordingly, when the training mode is terminated, the comparator 1213 may not additionally consume power.

Figure 9:
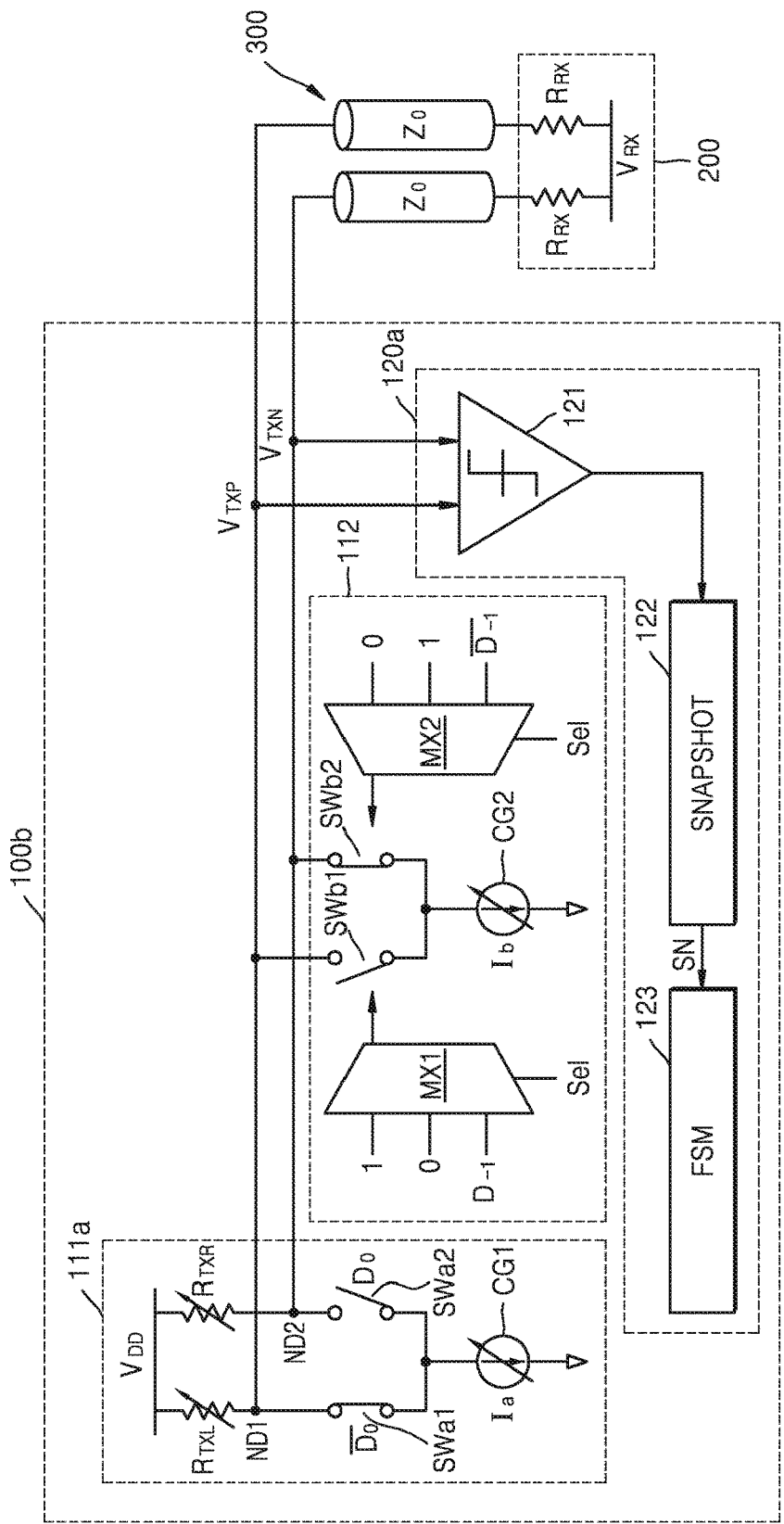
FIG. 9 is a circuit diagram illustrating a first device according to an example embodiment of the inventive concepts.

FIG. 9 is a circuit diagram illustrating a first device 100b according to an example embodiment.

Referring to FIG. 9, the first device 100b may include a driver 111a, the data selector 112, and a monitor 120a. Some components of the first device 100a illustrated in FIG. 5 are briefly illustrated to explain training operations of the first device 100b in FIGS. 11a through 17b. Thus, descriptions given above with reference to FIGS. 5 through 8 may also be applied to the present example embodiment. For convenience of explanation, one of the plurality of drivers 111 illustrated in FIG. 5, one of the plurality of second MUXs 1122 included in the first data selector 112a, and one of the plurality of second MUXs 1122 included in the second data selector 112b are illustrated.

The driver 111a may include the first variable transmission resistor $R_{TXL}$ connected between the power voltage terminal $V_{DD}$ and the first output node ND1, the second variable transmission resistor $R_{TXR}$ connected between the power voltage terminal $V_{DD}$ and the second output node ND2, a first switch SWa1 driven according to the negative data signal $\overline{D_0}$, a second switch SWa2 driven according to the positive data signal $D_0$, and the first current generator CG1 connected to the first and second switches SWa1 and SWa2 and providing the first current $I_a$. The first and second switches SWa1 and SWa2 may correspond to the first and second transistors TR1 and TR2 in FIG. 5, respectively.

The data selector 112 may include a first MUX MX1 and a second MUX MX2, a third switch SWb1 and a fourth switch SWb2, and a second current generator CG2 connected to the third and fourth switches SWb1 and SWb2 and providing a second current $I_b$. The first MUX MX1 may receive a positive previous data signal $D_{-1}$, 1, and 0, and may output a first selection signal in response to the selection signal Sel. The second MUX MX2 may receive a negative previous data signal $D_{-1}$, 1, and 0, and may output a second selection signal in response to the selection signal Sel. The third switch SWb1 may be driven according to the first selection signal to provide the second current $I_b$ to the first output node ND1. The fourth switch SWb2 may be driven according to the second selection signal to provide the second current $I_b$ to the second output node ND2.

Figure 10:
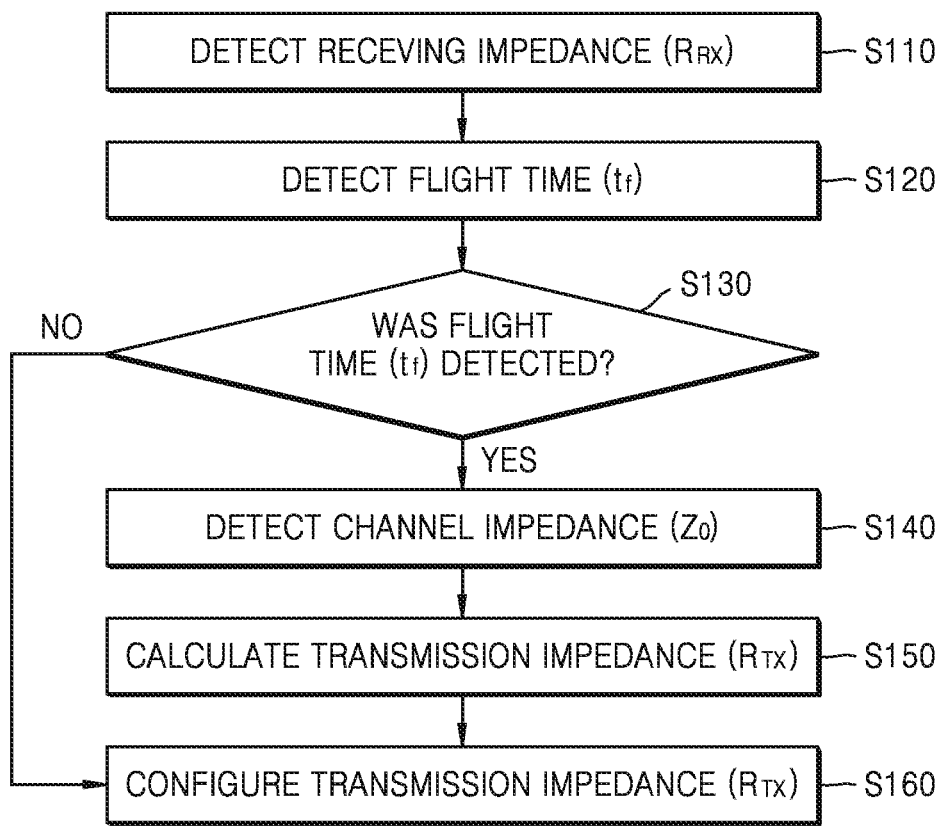
FIG. 10 is a flowchart of a method of configuring transmission impedance, according to an example embodiment of the inventive concepts.

FIG. 10 is a flowchart of a method of configuring the transmission impedance $R_{TX}$ according to an e example embodiment.

Referring to FIG. 10, the method of configuring the transmission impedance $R_{TX}$ according to the present example embodiment may be performed in a transmitter, for example, the first device 100 in FIG. 1 or the first device 100b in FIG. 9. Here, the channel 300 may be a direct current (DC) coupled channel. For example, the channel 300 may be a quick path interconnect (QPI) or the like. Hereinafter, descriptions are given with reference to FIGS. 9 and 10. The first device 100b may sequentially perform operations S110 through S160 in the training mode. The training mode may correspond to a time interval for configuring the transmission impedance $R_{TX}$ adaptively to the channel impedance $Z_0$ and the receiving impedance $R_{RX}$. When the training mode is completed, the first device 100b may transmit a normal data signal to the second device 200 in the normal mode.

The first device 100b may detect the receiving impedance $R_{RX}$ (S110). For example, the first device 100b may configure the first current $I_a$, the first variable transmission resistor $R_{TXL}$, and the second variable transmission resistor $R_{TXR}$, and may vary the second current $I_b$ to obtain the second current $I_b$ that makes the first voltage level $V_{TXP}$ equal to the second voltage level $V_{TXN}$ and to detect the receiving impedance $R_{RX}$ based on the obtained second current $I_b$. Descriptions of operation S110 will be given in detail with reference to FIGS. 11A through 12B.

The first device 100b may detect a flight time $t_f$ (S120). For example, the first device 100b may configure the first current $I_a$, the first variable transmission resistor $R_{TXL}$, and the second variable transmission resistor $R_{TXR}$, apply a single pulse signal to the positive data signal $D_0$ and the negative data signal $\overline{D_0}$, and monitor a reflection amount of the single pulse signal. Next, the first device 100b may vary the second current $I_b$ to detect a time point at which a signal reflected from the second device 200 is input to the first device 100b, and accordingly, may detect the flight time $t_f$. Descriptions of operation S120 will be given in detail with reference to FIGS. 13A through 13C.

The first device 100b may determine whether the flight time $t_f$ has been detected (S130). When it is determined that the flight time $t_f$ has not been detected, the first device 100b may determine that the impedance matching constraint is satisfied, configure the transmission impedance $R_{TX}$ to the maximum value, and end the training mode. For example, when an amount of reflection in the second device 200 is little or a length of the channel 300 is short, the flight time $t_f$ may not be detected. By configuring the transmission impedance $R_{TX}$ to the maximum value thereof, the first device 100b may increase a magnitude of the signal transmitted to the second device 200.

On the other hand, when it is determined that the flight time $t_f$ has been detected, operation S140 may be performed. The first device 100b may detect the channel impedance $Z_0$ based on the flight time $t_f$ (S140). For example, the first device 100b may configure the first current $I_a$, the first variable transmission resistor $R_{TXL}$, and the second variable transmission resistor $R_{TXR}$, and apply a step pulse signal to the positive data signal $D_0$ and the negative data signal $\overline{D_0}$. Subsequently, the first device 100b may vary the second current $I_b$ to obtain a value of the second current $I_b$ which equalizes the first voltage level $V_{TXP}$ and the second voltage level $V_{TXN}$ within the time interval corresponding to twice the flight time $t_f$, and may detect the channel impedance $Z_0$ based on the obtained second current $I_b$. Descriptions of operation S140 will be given in detail with reference to FIGS. 14A through 14C.

The first device 100b may calculate the transmission impedance $R_{TX}$ by applying the detected receiving impedance $R_{RX}$ and channel impedance $Z_0$ to the relaxed impedance matching constraint (that is, Formula 4) (S150). The first device 100b may configure impedance of the transmitting block 110 to the transmission impedance $R_{TX}$ (S160). For example, the monitor 120 may generate selected signals (for example, the zeroth through $k^{th}$ selection signals $Sel_{R0}$ through $Sel_{Rk}$ in FIG. 6) according to the calculated transmission impedance $R_{TX}$ such that the first and second transmission resistors $R_{TXL}$ and $R_{TXR}$ have the value of the transmission impedance $R_{TX}$.

FIGS. 11A through 12B illustrate a receiving impedance $R_{RX}$ detection operation according to operation S110 in FIG. 10.

Figure 11A:
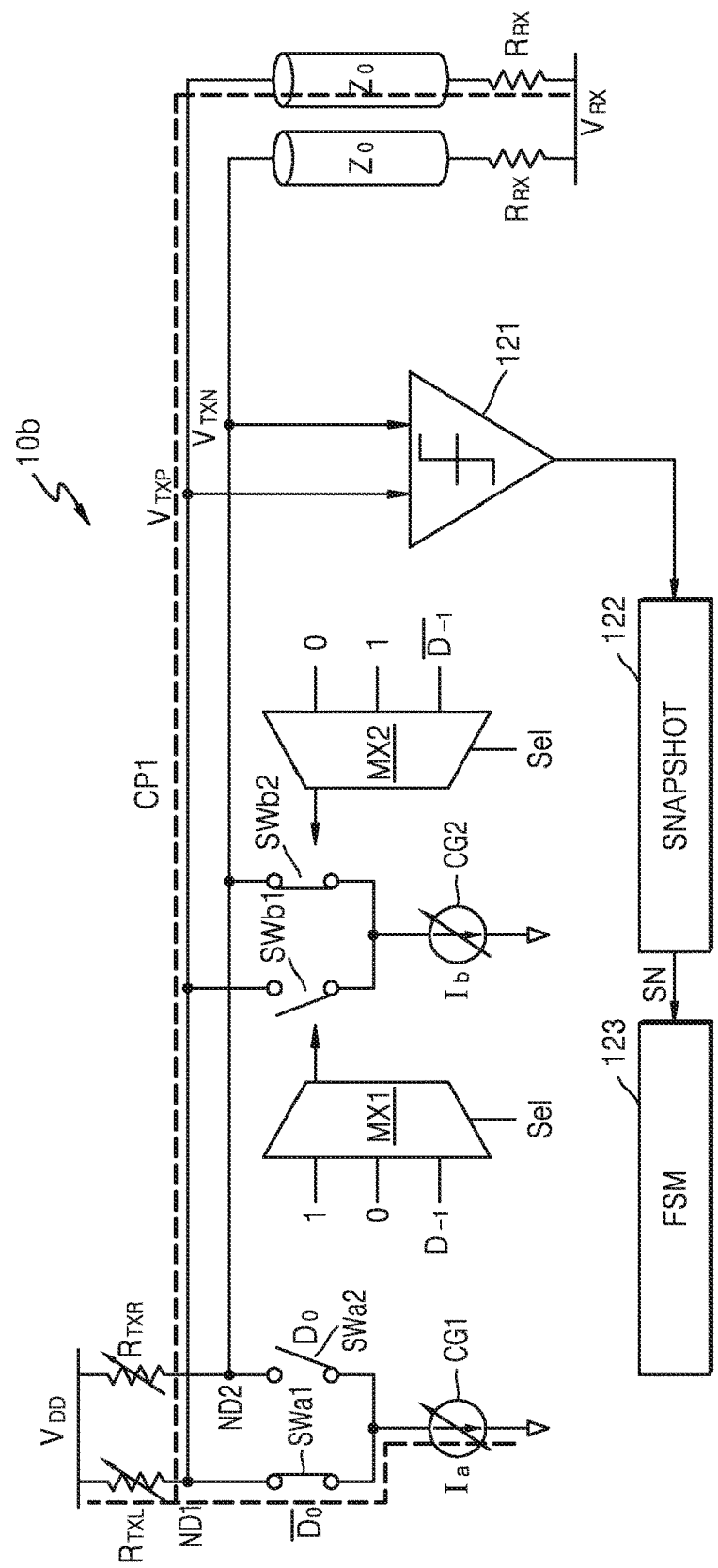
FIGS. 11A through 12B illustrate a receiving impedance detection operation according to an operation S110 in FIG. 10.
Figure 11B:
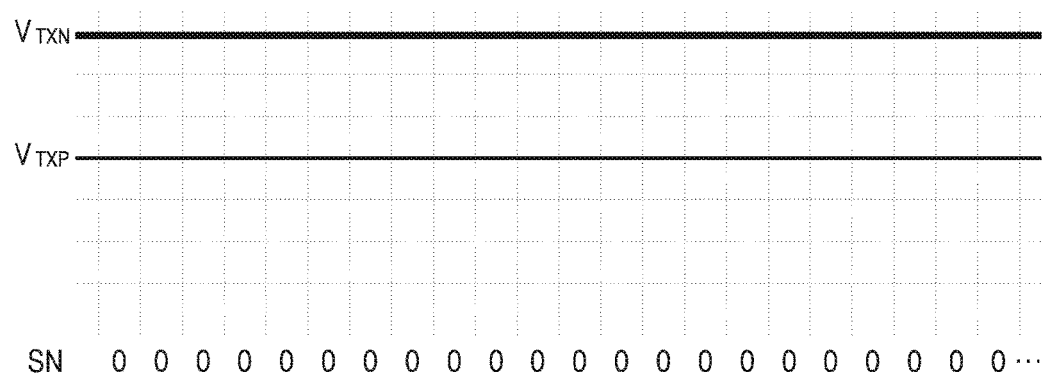
Figure 12A:
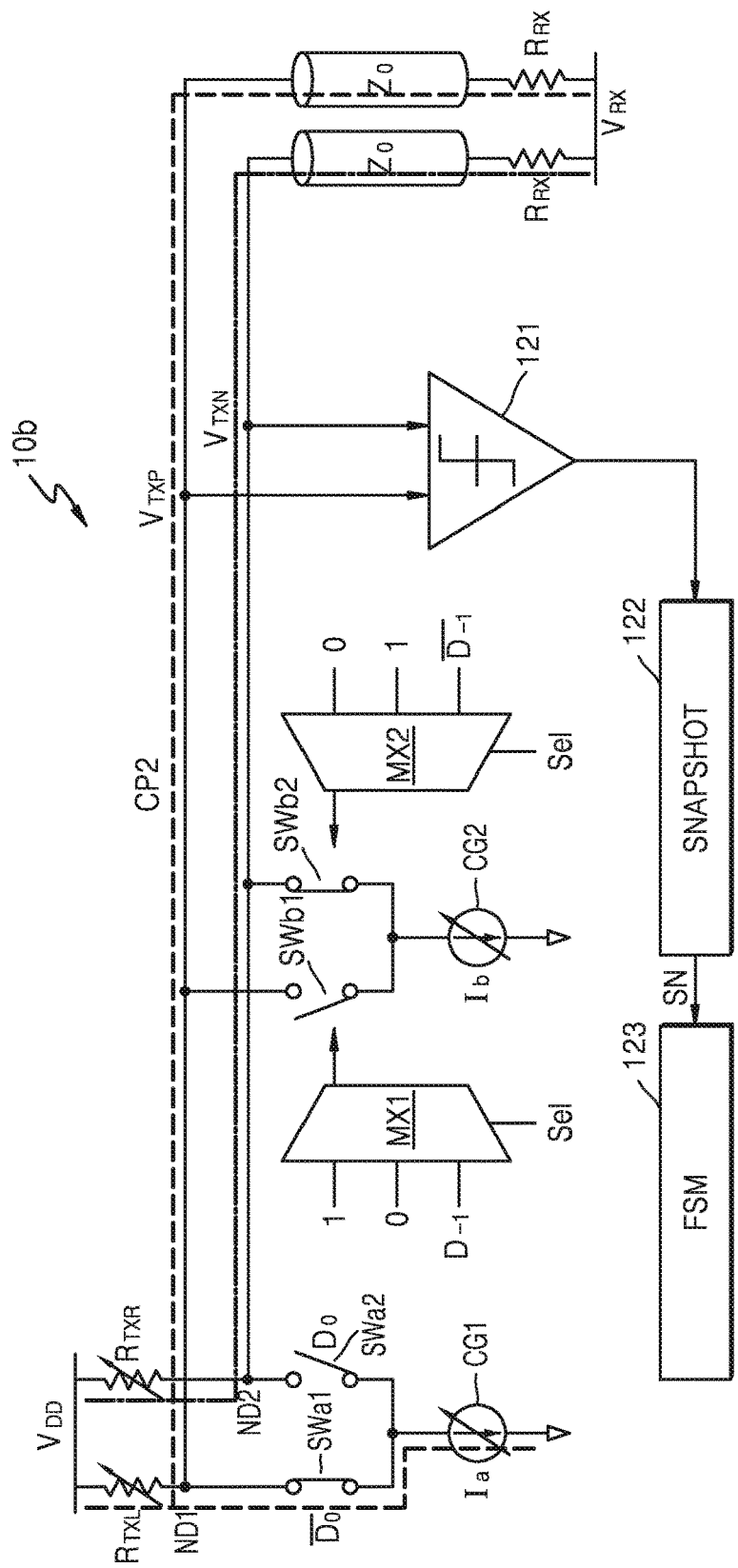
Figure 12B:
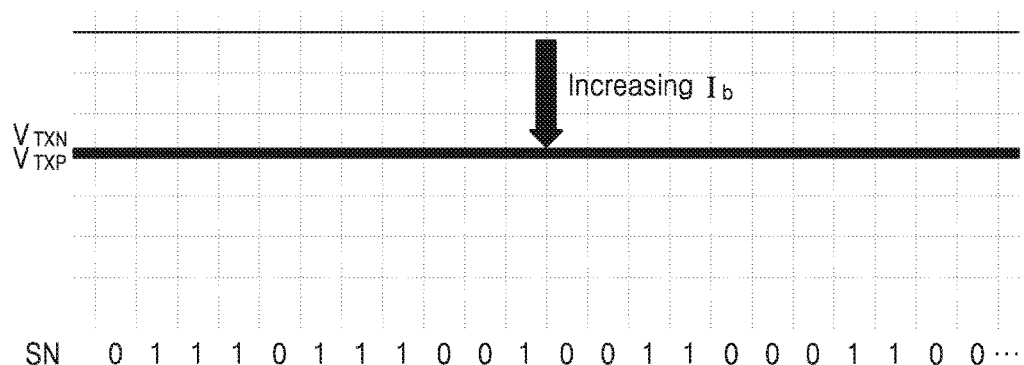

FIG. 11A illustrates a first current path CP1 for detecting the receiving impedance $R_{RX}$ in the training mode, and FIG. 11B illustrates the first voltage level $V_{TXP}$, the second voltage level $V_{TXN}$, and the snapshot signal SN when a system 10b has the first current path CP1 in FIG. 11A. In addition, FIG. 12A illustrates a second current path CP2 for detecting the receiving impedance $R_{RX}$ in the training mode, and FIG. 12B illustrates the first voltage level $V_{TXP}$, the second voltage level $V_{TXN}$, and the snapshot signal SN when the system 10b has the second current path CP2 in FIG. 12A. The system 10b may have the first current path CP1 in FIG. 11A and the second current path CP2 in FIG. 12A in sequence. After the snapshot signal SN in FIG. 11B has been generated, the system 10b may have the second current path CP2 in FIG. 12A, and accordingly, the first device 100b may generate the snapshot signal SN in FIG. 12B. Hereinafter, descriptions are given with reference to FIGS. 9 through 12B.

Firstly, the first current $I_a$ may be configured to a fixed value, and the first and second variable transmission resistors $R_{TXL}$ and $R_{TXR}$ may be configured to have different resistance values from each other. For example, the resistance value of the first variable transmission resistance $R_{TXL}$ may be configured to $R_{TXL1}$, the resistance value of the second variable transmission resistance $R_{TXR}$ may be configured to $R_{TXR1}$, and the current amount of the first current $I_a$ may be configured to $I_{a1}$, wherein $R_{TXL1}$ is not equal to $R_{TXR1}$. At this time, the first switch SWa1 may be turned on and the first current $I_a$ may be supplied to the channel 300 via the first output node ND1. On the other hand, the second switch SWa2 may be turned off, and the first current $I_a$ may not be supplied to the second output node ND2. Thus, the second voltage level $V_{TXN}$ of the second output node ND2 may correspond to the power voltage terminal $V_{DD}$, and the first voltage level $V_{TXP}$ of the first output node ND1 may be less than a voltage of the power voltage terminal $V_{DD}$. In this case, the snapshot signal SN captured in the SNAPSHOT 122 may be 0000 . . . , as illustrated in FIG. 11B, and accordingly, an average of bits of the snapshot signal SN may be almost 0.

Next, the fourth switch SWb2 may be turned on, and the second current $I_b$ may be provided to the second output node ND2. As the second current $I_b$ is increased, the second voltage level $V_{TXN}$ of the second output node ND2 may decrease. The FSM 123 may sense a time point at which the second voltage level $V_{TXN}$ becomes equal to the first voltage level $V_{TXP}$ based on the snapshot signal SN, and may detect a current amount of the second current $I_b$. The FSM 123 may determine that the second voltage level $V_{TXN}$ becomes equal to the first voltage level $V_{TXP}$ at a time point at which the average of bits of the snapshot signal SN is about 0.5. The first voltage level $V_{TXP}$ and the second voltage level $V_{TXN}$ may be expressed by Formula 7 and Formula 8, respectively.

$$V_{TXP} = \frac{1}{R_{TXL} + R_{RX}}(R_{RX} \; V_{DD} + R_{TXL}V_{RX} - R_{TXL}R_{RX}I_a) \quad \text{[Formula 7]}$$

$$V_{TXN} = \frac{1}{R_{TXR} + R_{RX}}(R_{RX} \; V_{DD} + R_{TXR}V_{RX} - R_{TXL}R_{RX}I_b) \quad \text{[Formula 8]}$$

The receiving impedance $R_{RX}$ may be detected by substituting current amounts of the second current $I_b$ detected in the first variable transmission resistor $R_{TXL}$, the second variable transmission resistor $R_{TXR}$, the power voltage terminal $V_{DD}$, the first current $I_a$, and the FSM 123 into Formulas 7 and 8. The operations illustrated in FIGS. 11A through 12B may be repeatedly performed, wherein the resistance values of the first and second variable transmission resistors $R_{TXL}$ and $R_{TXR}$ may be changed. For example, it may be configured that the resistance value of the first variable transmission resistor $R_{TXL}$ is $R_{TXL2}$, the resistance value of the second variable transmission resistor $R_{TXR}$ is $R_{TXR2}$, the current amount of the first current $I_a$ is $I_{a2}$, wherein $R_{TXL2}$ is not equal to $R_{TXR2}$. The system 10b may again have the first and second current paths CP1, CP2 illustrated in FIGS. 11A and 12A in sequence. At this time, the receiving impedance $R_{RX}$ may be detected by applying the current amount of the obtained second current $I_b$ to Formulas 7 and 8.

Figure 13A:
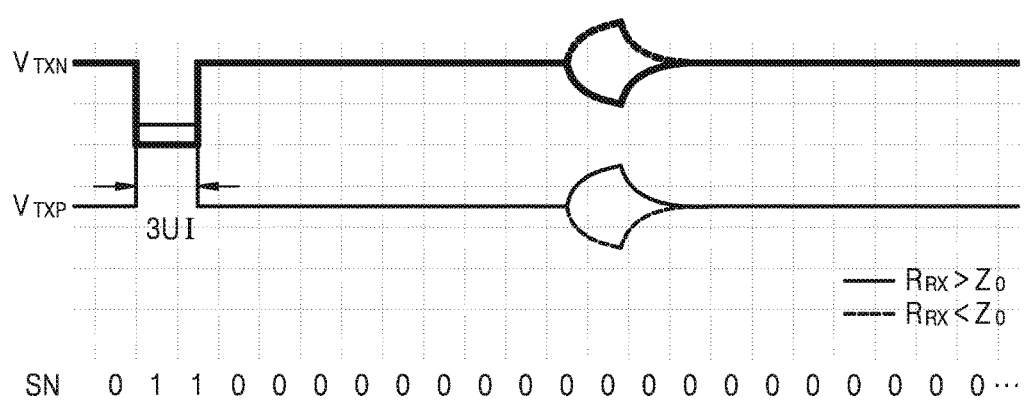
FIGS. 13A through 13C illustrate a flight time detection operation according to an operation S120 in FIG. 10.
Figure 13B:
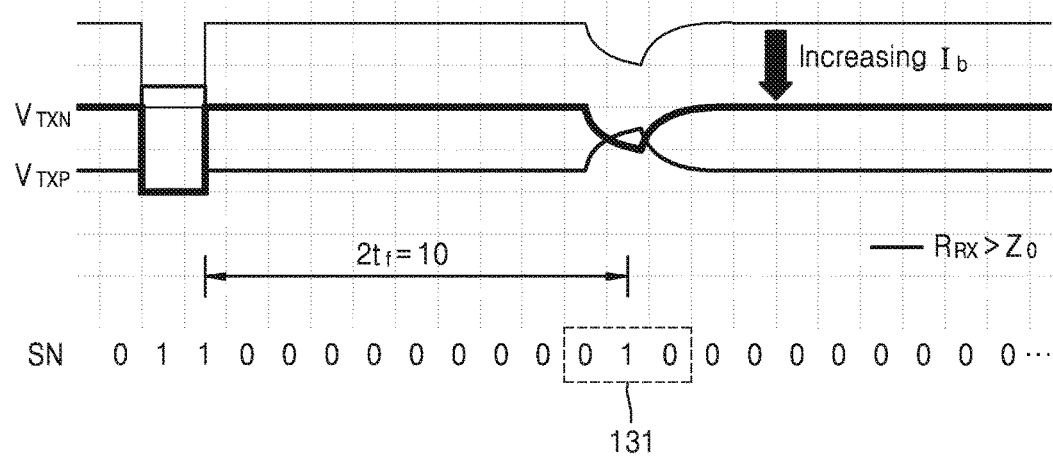
Figure 13C:
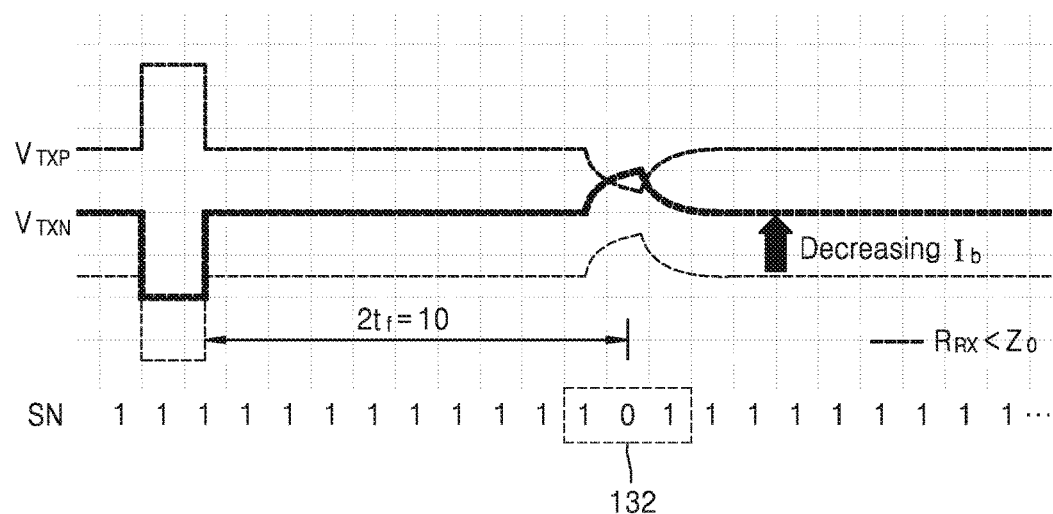

FIGS. 13A through 13C illustrate the flight time to detection operation according to operation S120 in FIG. 10.

Referring to FIG. 13A, in the training mode, the resistance values of the first variable transmission resistor $R_{TXL}$ and the second variable transmission resistor $R_{TXR}$ may be configured to the same value, and a single pulse signal having a pulse width of three times a unit interval UI may be applied to the positive data signal $D_0$ and, the negative data signal $\overline{D_0}$. At this time, the unit interval UI may correspond to a single time slot. The pulse width of the single pulse signal may not be limited to three times the unit interval UI, but may be configured to an arbitrary interval that is at least twice the unit interval UI. A bit of the snapshot signal SN may be 1 in an interval where the first voltage level $V_{TXP}$ is greater than the second voltage level $V_{TXN}$, and the bit of the snapshot signal SN may be 0 in an interval where the first voltage level $V_{TXP}$ is less than the second voltage level $V_{TXN}$.

When the receiving impedance $R_{RX}$ is greater than the channel impedance $Z_0$, an overshooting may occur in the first voltage level $V_{TXP}$ at a time point at which the transmission signal reaches the first device 100b after having been reflected at the second device 200. On the other hand, when the receiving impedance $R_{RX}$ is less than the channel impedance $Z_0$, an undershooting may occur in the first voltage level $V_{TXP}$ at the time point at which the transmission signal reaches the first device 100b after having been reflected at the second device 200. In addition, when the receiving impedance $R_{RX}$ is greater than the channel impedance $Z_0$, the undershooting may occur in the second voltage level $V_{TXN}$ at the time at which the transmission signal reaches the first device 100b after having been reflected at the second device 200. On the other hand, when the receiving impedance $R_{RX}$ is less than the channel impedance $Z_0$, the overshooting may occur in the second voltage level $V_{TXN}$ at the time point at which the transmission signal reaches the first device 100b after having been reflected at the second device 200.

Referring to FIG. 13B, the fourth switch SWb2 may be turned on and the second current $I_b$ may be supplied to the second output node ND2. At this time, while the second current Ib is increased, the second voltage level $V_{TXN}$ may decrease. According to the present example embodiment, a 010 pattern 131 may be obtained in the snapshot signal SN while the second current Ib is increased. When the 010 pattern 131 is obtained in the snapshot signal SN, a time duration from a time point at which the signal has been transmitted in the first device 100b to the time slot corresponding to a bit of 1 may correspond to $2*t_f$ which is twice the flight time $t_f$ (for example, $2*t_f=10$). On the other hand, when the 010 pattern is not obtained in the snapshot signal SN, the second current $I_b$ may be reduced.

Referring to FIG. 13C, the fourth switch SWb2 may be turned on and the second current $I_b$ may be supplied to the second output node ND2. At this time, as the second current $I_b$ is reduced, the second voltage level $V_{TXN}$ may increase. According to the present example embodiment, a 101 pattern 132 may be obtained in the snapshot signal SN as the second current $I_b$ is decreased. When the 101 pattern 132 is obtained in the snapshot signal SN, a time duration from a time point at which the signal has been transmitted in the first device 100b to the time slot corresponding to a bit of 1 may correspond to $2*t_f$ which is twice the flight time $t_f$ (for example, $2*t_f=10$). When both the 010 pattern and the 101 pattern are not obtained in the snapshot signal SN, it may be determined that an impedance matching has been performed (in other words, $R_{RX}$ is almost the same as $Z_0$). At this time, the transmission impedance $R_{TX}$ may be configured to the maximum value, and the training mode may be ended and an impedance adaptation process may be ended.

Figure 14A:
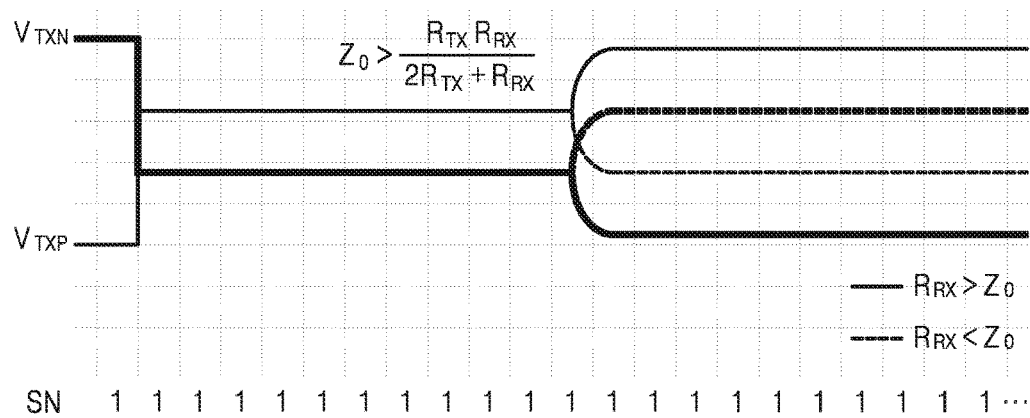
FIGS. 14A through 14C illustrate a channel impedance detection operation according to an operation S140 in FIG. 10.
Figure 14B:
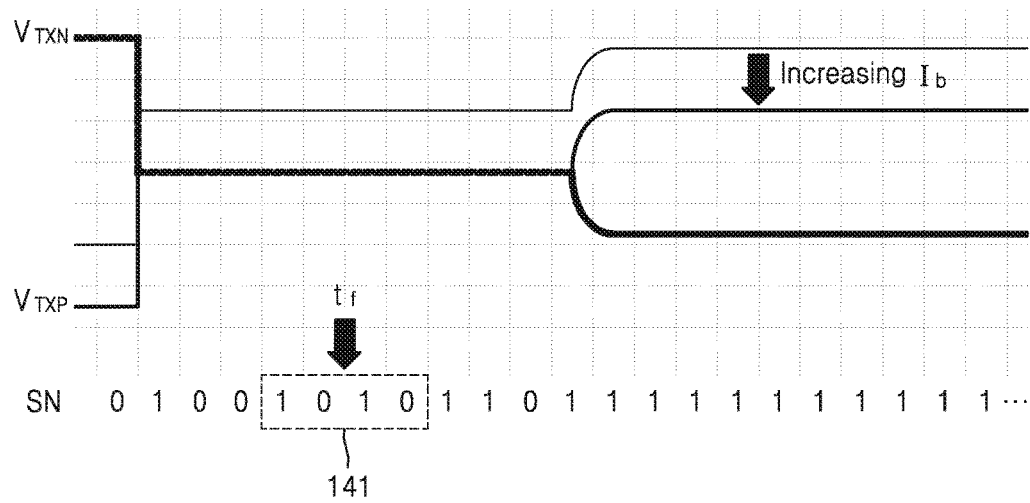
Figure 14C:
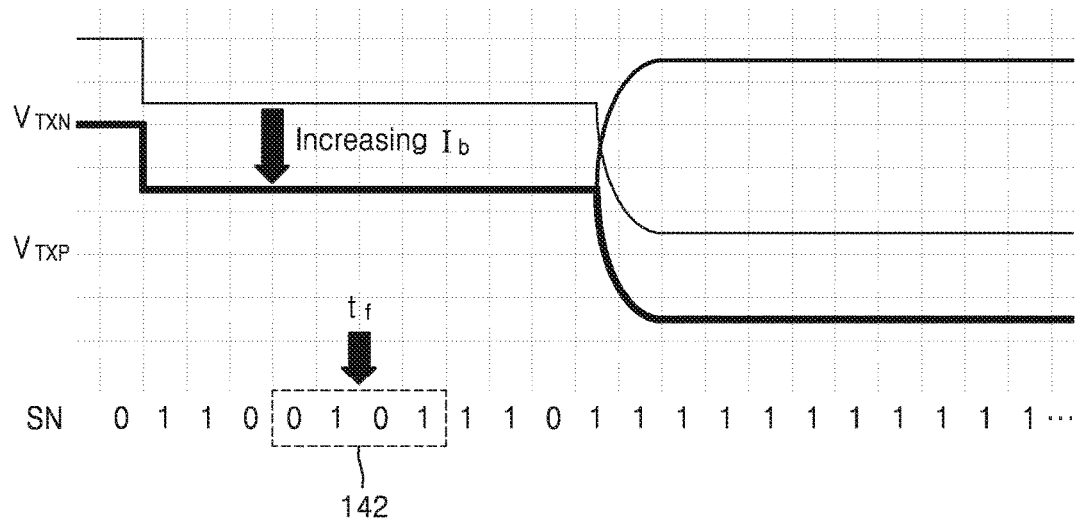

FIGS. 14A through 14C illustrate the channel impedance $Z_0$ detection operation according to operation S140 in FIG. 11.

Referring to FIG. 14A, in the training mode, the resistance values of the first variable transmission resistor $R_{TXL}$ and the second variable transmission resistor $R_{TXR}$ may be configured to the same value, and a unit step pulse signal may be applied to the positive data signal $D_0$ and the negative data signal $\overline{D_0}$. At this time, the snapshot signal SN may be as illustrated in FIG. 14A. The channel impedance $Z_0$ may be calculated by using a characteristic that a magnitude of a voltage input to the channel 300 is determined by the channel impedance $Z_0$ and the transmission impedance $R_{TX}$. When the magnitude of the channel impedance $Z_0$ is greater than a value of $R_{TX}R_{RX}/(2R_{TX}+R_{RX})$, the first voltage level $V_{TXP}$ may be greater than the second voltage level $V_{TXN}$ around the flight time $t_f$, and accordingly, a bit average of the snapshot signal SN may be about 1 around the flight time $t_f$.

When the receiving impedance $R_{RX}$ is greater than the channel impedance $Z_0$, the first voltage level $V_{TXP}$ may increase at the time point at which the transmission signal reaches the first device 100b after having been reflected at the second device 200. On the other hand, when the receiving impedance $R_{RX}$ is less than the channel impedance $Z_0$, the first voltage level $V_{TXP}$ may decrease at the time point at which the transmission signal reaches the first device 100b after having been reflected at the second device 200. In addition, when the receiving impedance $R_{RX}$ is greater than the channel impedance $Z_0$, the second voltage level $V_{TXN}$ may decrease at the time point at which the transmission signal reaches the first device 100b after having been reflected at the second device 200. On the other hand, when the receiving impedance $R_{RX}$ is less than the channel impedance $Z_0$, the second voltage level $V_{TXN}$ may increase at the time point at which the transmission signal reaches the first device 100b after having been reflected at the second device 200.

Referring to FIG. 14B, the third switch SWb1 may be turned on and the second current $I_b$ may be provided to the first output node ND1. At this time, while the second current $I_b$ is increased, the first voltage level $V_{TXP}$ may decrease. According to the present example embodiment, the current amount of the second current $I_b$ which causes the first voltage level $V_{TXP}$ and the second voltage level $V_{TXN}$ to be equal around the flight time $t_f$ may be detected by increasing the second current $I_b$. For example, a 1010 pattern 141 with the bit average of about 0.5 in the snapshot signal SN may be obtained while the second current Ib is increased.

The FSM 123 may sense the time point at which the second voltage level $V_{TXN}$ becomes equal to the first voltage level $V_{TXP}$ based on the snapshot signal SN, and may detect a current amount of the second current $I_b$. When the bit average of the snapshot signal SN is about 0.5, that is, when the 1010 pattern 141 is obtained, the FSM 123 may determine that the second voltage level $V_{TXN}$ is equal to the first voltage level $V_{TXP}$. At this time, the channel impedance $Z_0$ may be calculated by using Formula 9 below.

$$Z_0 = \frac{1}{\frac{2I_a(R_{TX} + R_{RX})}{R_{TX}R_{RX}(I_a + I_b)} - \frac{1}{R_{TX}}}$$ [Formula 9]

Referring to FIG. 14C, when the magnitude of the channel impedance $Z_0$ is less than $R_{TX}R_{RX}/(2R_{TX}+R_{RX})$, the first voltage level $V_{TXP}$ may be less than the second voltage level $V_{TXN}$ around the flight time $t_f$, and accordingly, the second current $I_b$ may not be detected. According to the present example embodiment, the fourth switch SWb2 may be turned on and the second current $I_b$ may be provided to the second output node ND2. At this time, while the second current Ib is increased, the second voltage level $V_{TXN}$ may decrease. According to the present example embodiment, the current amount of the second current Ib which causes the first voltage level $V_{TXP}$ and the second voltage level $V_{TXN}$ to be equal around the flight time $t_f$ may be detected. For example, a 0101 pattern 142 with the bit average of about 0.5 in the snapshot signal SN may be obtained while the second current Ib is increased.

The FSM 123 may sense the time point at which the second voltage level $V_{TXN}$ becomes equal to the first voltage level $V_{TXP}$ based on the snapshot signal SN, and may find the current amount of the second current $I_b$. When the bit average of the snapshot signal SN is about 0.5, that is, when the 0101 pattern 142 is obtained, the FSM 123 may determine that the second voltage level $V_{TXN}$ is equal to the first voltage level $V_{TXP}$. At this time, the channel impedance $Z_0$ may be calculated by using Formula 10 below.

$$Z_0 = \frac{1}{\frac{2I_a(R_{TX} + R_{RX})}{R_{TX}R_{RX}(I_a + I_b)} - \frac{1}{R_{TX}}}$$ [Formula 10]

The FSM 123 may calculate the transmission impedance $R_{TX}$ by applying the detected receiving impedance $R_{RX}$ and channel impedance $Z_0$ to the relaxed impedance matching constraint (that is, Formula 4). Next, the FSM 123 may configure resistance values of the first and second variable transmit resistors $R_{TXL}$ and $R_{TXR}$ to the transmission impedance $R_{TX}$. Thereby, the training mode may be ended and the impedance adaptation process may be ended.

Figure 15:
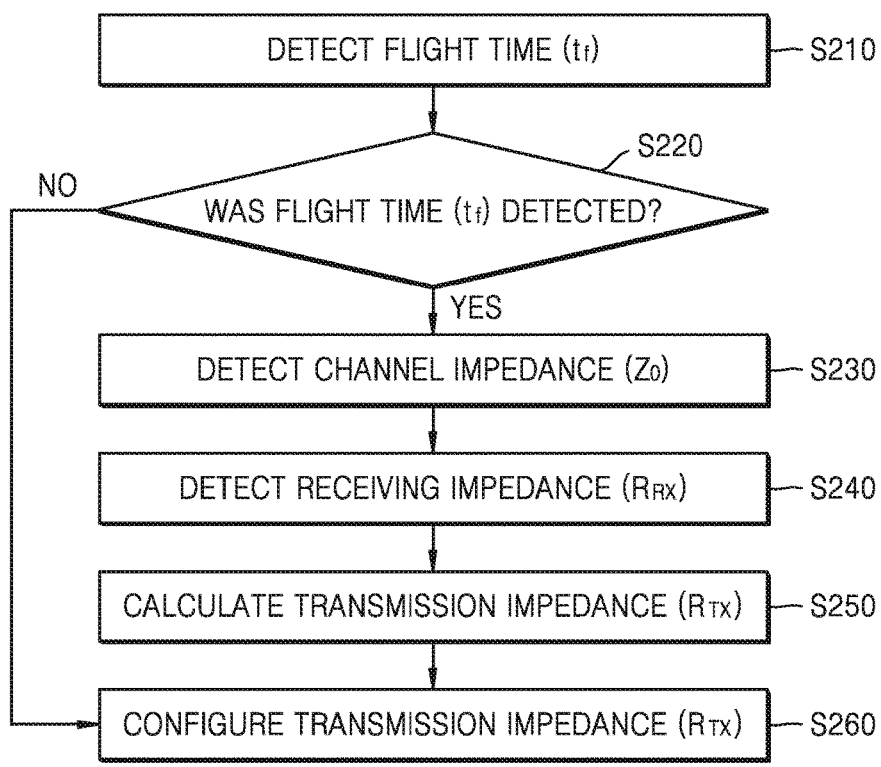
FIG. 15 is a flowchart of a method of configuring transmission impedance, according to an example embodiment of the inventive concepts.

FIG. 15 is a flowchart of a method of configuring the transmission impedance $R_{TX}$ according to an example embodiment.

Referring to FIG. 15, the method of configuring the transmission impedance $R_{TX}$ according to the present example embodiment may be performed in a transmitter, for example, the first device 100 in FIG. 1 or the first device 100b in FIG. 9. At this time, the channel 300 may be an alternating current (AC) coupled channel. For example, the channel 300 may be universal serial bus (USB), serial advanced technology attachment (ATA) (SATA), high-definition multimedia interface (HDMI), peripheral component interconnect express (PCIe), a backplane, etc. Hereinafter, descriptions are given with reference to FIGS. 9 and 15. The first device 100b may sequentially perform operations S210 through S260 in the training mode. In the case where the channel 300 is an AC coupled channel, since a DC component is blocked, the receiving impedance $R_{RX}$ may not be detected in a manner illustrated in FIGS. 11A through 12B. Accordingly, when the channel 300 is the AC coupled channel, a sequence of the operations included in a transmission impedance $R_{TX}$ configuration method may be different from that illustrated in FIG. 10.

The first device 100b may detect a flight time $t_f$ (S210). For example, the first device 100b may configure the first current $I_a$, the first variable transmission resistor $R_{TXL}$, and the second variable transmission resistor $R_{TXR}$, and may apply the single pulse signal to the positive data signal $D_0$ and the negative data signal $\overline{D_0}$. Next, the first device 100b may vary the second current $I_b$ to detect a time point at which a signal reflected from the second device 200 is input to the first device 100b, and accordingly, may detect the flight time $t_f$. Operation S210 may be performed similarly to an example embodiment illustrated in FIGS. 13A through 13C.

The first device 100b may determine whether the flight time $t_f$ has been detected (S220). When it is determined that the flight time $t_f$ has not been detected, the first device 100b may determine that the impedance matching constraint is satisfied, and configure the transmission impedance $R_{TX}$ to the maximum value (S260), and end the training mode. For example, when the amount of reflection in the second device 200 is little or the length of the channel 300 is short, the flight time $t_f$ may not be detected. By configuring the transmission impedance $R_{TX}$ to the maximum value thereof, the first device 100b may increase a magnitude of the signal transmitted to the second device 200.

On the other hand, when it is determined that the flight time $t_f$ has been detected, an operation S230 may be performed. The first device 100b may detect the channel impedance $Z_0$ based on the flight time $t_f$ (S230). For example, the first device 100b may configure the first current $I_a$, the first variable transmission resistor $R_{TXL}$, and the second variable transmission resistor $R_{TXR}$, and may apply the step pulse signal to the positive data signal $D_0$ and the negative data signal $\overline{D_0}$. Subsequently, the first device 100b may vary the second current $I_b$ to obtain the value of the second current $I_b$ which equalizes the first voltage level $V_{TXP}$ and the second voltage level $V_{TXN}$ within the time interval corresponding to twice the flight time $t_f$ and may detect the channel impedance $Z_0$ based on the obtained second current $I_b$. Descriptions of operation S230 will be given in detail with reference to FIGS. 16A and 16B.

The first device 100b may detect the receiving impedance $R_{RX}$ (S240). For example, the first device 100b may configure the first current $I_a$, the first variable transmission resistor $R_{TXL}$, and the second variable transmission resistor $R_{TXR}$, and may vary the second current $I_b$ to obtain the second current $I_b$ that makes the first voltage level $V_{TXP}$ equal to the second voltage level $V_{TXN}$, and to detect the receiving impedance $R_{RX}$ based on the obtained second current Ib. Descriptions of operation S240 will be given in detail with reference to FIGS. 17A and 17B.

The first device 100b may calculate the transmission impedance $R_{TX}$ by applying the detected receiving impedance $R_{RX}$ and channel impedance $Z_0$ to the relaxed impedance matching constraint (S250). The first device 100b may configure impedance of the transmitting block 110 to the transmission impedance $R_{TX}$ (S260). For example, the monitor 120 may generate selected signals (for example, the zeroth through k$^{th}$ selection signals $Sel_{R0}$ through $Sel_{Rk}$ in FIG. 6) according to the calculated transmission impedance $R_{TX}$ such that the first and second transmission resistors $R_{TXL}$ and $R_{TXR}$ have the value of the transmission impedance $R_{TX}$.

Figure 16A:
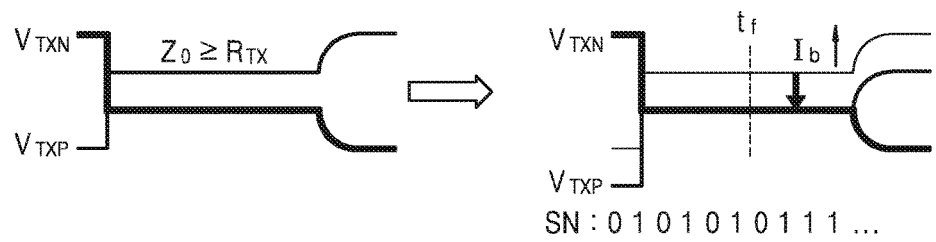
FIGS. 16A and 16B illustrate a channel impedance detection operation according to an operation S230 in FIG. 15.
Figure 16B:
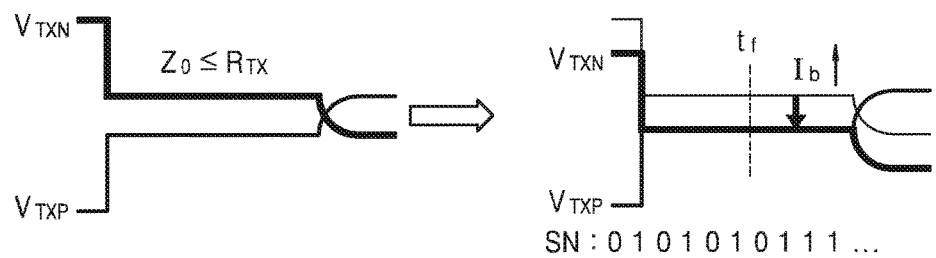

FIGS. 16A and 16B illustrate the channel impedance $Z_0$ detection operation according to operation S230 in FIG. 15.

Referring to FIG. 16A, in the training mode, the resistance values of the first variable transmission resistor $R_{TXL}$ and the second variable transmission resistor $R_{TXR}$ may be configured to the same value, and the unit step pulse signal may be applied to the positive data signal $D_0$ and the negative data signal $\overline{D_0}$. When the channel impedance $Z_0$ is equal to or greater than the transmission impedance $R_{TX}$, the first voltage level $V_{TXP}$ may be greater than the second voltage level $V_{TXN}$ around the flight time $t_f$.

According to the present example embodiment, the third switch SWb1 may be turned on and the second current $I_b$ may be provided to the first output node ND1. At this time, the time point at which the first voltage level $V_{TXP}$ and the second voltage level $V_{TXN}$ become equal to each other around the flight time $t_f$ while the second current Ib is increased may be detected, and the current amount of the second current $I_b$ at the time point may be obtained. At this time, the channel impedance $Z_0$ may be calculated by using Formula 11 below.

$$Z_0 = \frac{I_a + I_b}{I_a - I_b} \cdot R_{TX} \qquad \text{[Formula 11]}$$

Referring to FIG. 16B, in the training mode, the resistance values of the first variable transmission resistor $R_{TXL}$ and the second variable transmission resistor $R_{TXR}$ may be configured to the same value, and the unit step pulse signal may be applied to the positive data signal $D_0$ and the negative data signal $\overline{D_0}$. When the channel impedance $Z_0$ is equal to or less than the transmission impedance $R_{TX}$, the second voltage level $V_{TXN}$ may be greater than the first voltage level $V_{TXP}$ around the flight time $t_f$.

According to the present example embodiment, the second current $I_b$ may be provided to the second output node ND2 by turning on the fourth switch SWb2. At this time, the time point at which the first voltage level $V_{TXP}$ and the second voltage level $V_{TXN}$ become equal to each other around the flight time $t_f$ while the second current $I_b$ is increased may be detected, and the current amount of the second current $I_b$ at the time point may be obtained. At this time, the channel impedance $Z_0$ may be calculated by using Formula 12 below.

$$Z_0 = \frac{I_a - I_b}{I_a + I_b} \cdot R_{TX} \qquad \text{[Formula 12]}$$

Figure 17A:
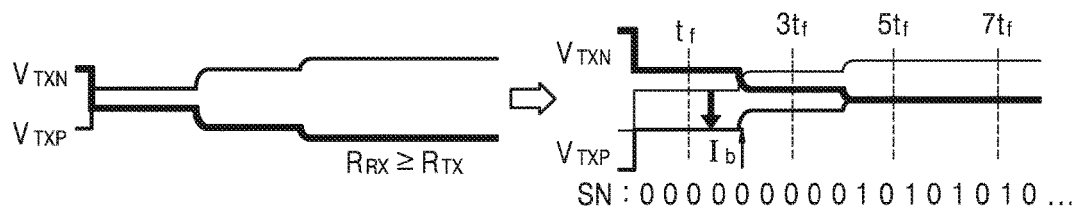
FIGS. 17A and 17B illustrate a receiving impedance detection operation according to an operation S240 in FIG. 15.
Figure 17B:
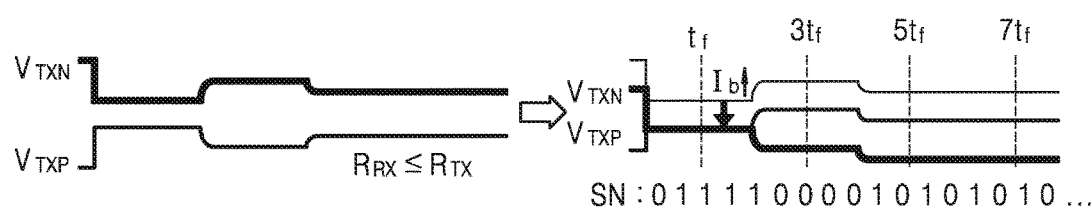

FIGS. 17A and 17B illustrate the receiving impedance $R_{RX}$ detection operation according to operation S240 in FIG. 15.

Referring to FIG. 17A, in the training mode, the resistance values of the first variable transmission resistor $R_{TXL}$ and the second variable transmission resistor $R_{TXR}$ may be configured to the same value, and the unit step pulse signal may be applied to the positive data signal $D_0$ and the negative data signal $\overline{D_0}$. When the receiving impedance $R_{RX}$ is equal to or greater than the transmission impedance $R_{TX}$, the first voltage level $V_{TXP}$ may be greater than the second voltage level $V_{TXN}$ around the flight time $t_f$.

According to the present example embodiment, the second current $I_b$ may be provided to the first output node ND1 by turning on the third switch SWb1. At this time, a time point at which the first voltage level $V_{TXP}$ and the second voltage level $V_{TXN}$ become equal to each other around a time point $(2N-1)t_f$ (N is a natural number) while the second current $I_b$ is increased may be detected, and when the time point at which the first voltage level $V_{TXP}$ and the second voltage level $V_{TXN}$ become equal to each other is detected, the current amount of the second current $I_b$ at the time point above may be detected. At this time, the receiving impedance $R_{RX}$ may be calculated by using Formula 13 below.

$$R_{RX} = \frac{I_a + I_b}{I_a - I_b} R_{TX} \qquad \text{[Formula 13]}$$

Referring to FIG. 17B, in the training mode, the resistance values of the first variable transmission resistor $R_{TXL}$ and the second variable transmission resistor $R_{TXR}$ may be configured to the same value, and the unit step pulse signal may be applied to the positive data signal $D_0$ and the negative data signal $\overline{D_0}$. When the receiving impedance $R_{RX}$ is equal to or less than the transmission impedance $R_{TX}$, the second voltage level $V_{TXN}$ may be greater than the first voltage level $V_{TXP}$ around the flight time $t_f$.

According to the present example embodiment, the second current $I_b$ may be provided to the second output node ND2 by turning on the fourth switch SWb2. At this time, the time point at which the first voltage level $V_{TXP}$ and the second voltage level $V_{TXN}$ become equal to each other around the time point $(2N-1)t_f$ (N is a natural number) while the second current $I_b$ is increased may be detected, and the current amount of the second current $I_b$ at the time point above may be obtained. At this time, the receiving impedance $R_{RX}$ may be calculated by using Formula 14 below.

$$R_{RX} = \frac{I_a - I_b}{I_a + I_b} R_{TX}$$ [Formula 14]

Next, the FSM 123 may calculate the transmission impedance $R_{TX}$ by applying the detected receiving impedance $R_{RX}$ and channel impedance $Z_0$ to the relaxed impedance matching constraint (that is, Formula 4). Next, the FSM 123 may configure resistance values of the first and second variable transmit resistors $R_{TXL}$ and $R_{TXR}$ to the transmission impedance $R_{TX}$. Thereby, the training mode may be ended and the impedance adaptation process may be ended.

Figure 18:
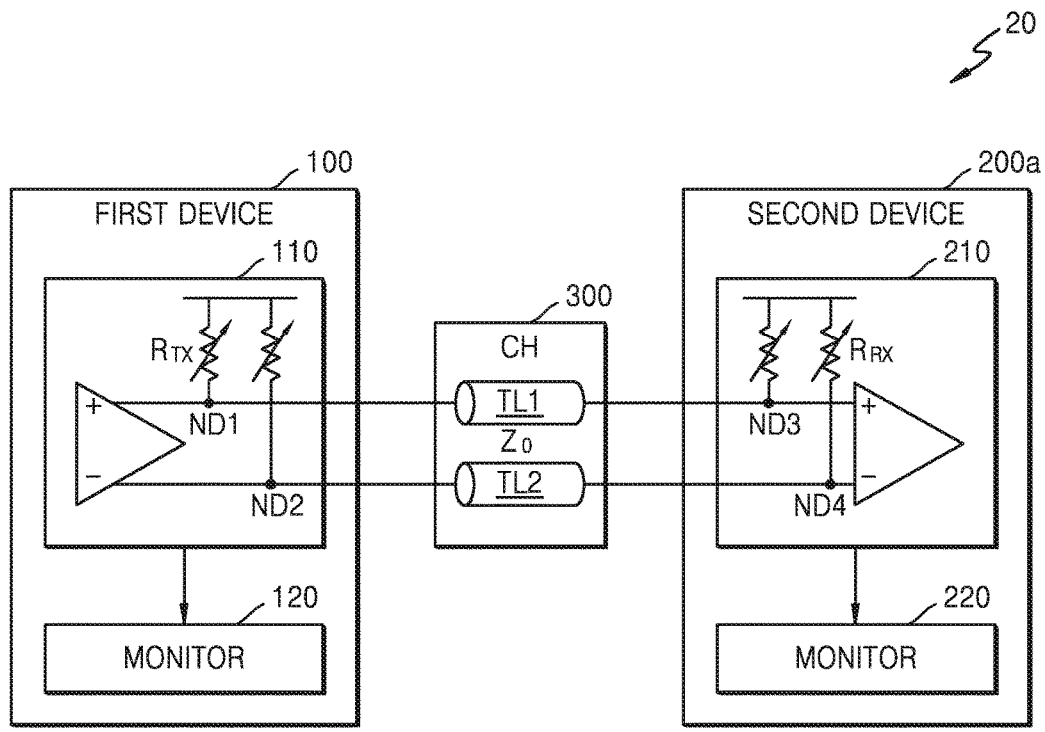
FIG. 18 illustrates a system according to an example embodiment of the inventive concepts.

FIG. 18 illustrates a system 20 according to an example embodiment.

Referring to FIG. 18, the system 20 may include the first device 100, a second device 200a, and the channel 300. The first device 100 and the second device 200a may be connected to each other via the channel 300. The system 20 according to the present example embodiment may correspond to a modified embodiment of the system 10 of FIG. 1, and the descriptions given above with reference to FIGS. 1 through 17B may also be applied to the present example embodiment.

The second device 200a may include the receiving block 210 and the monitor 220. The monitor 220 may detect the channel impedance $Z_0$ and the transmission impedance $R_{TX}$ by monitoring a voltage level of a first input node ND3 and a voltage level of a second input node ND4, and may configure the receiving impedance $R_{RX}$ based on the transmission impedance $Z_0$ and the transmission impedance $R_{TX}$. The monitor 220 may calculate the receiving impedance $R_{RX}$ according to the relaxed impedance matching constraint and configure the receiving impedance $R_{RX}$ of the receiving block 210 according to the calculated receiving impedance $R_{RX}$. In an example embodiment, the monitor 220 may be implemented as an eye monitoring circuit. In an example embodiment, the receiving block 210 and the monitor 220 may be implemented on the same chip.

As described above, embodiments have been disclosed in the drawings and specification. While the embodiments have been described herein with reference to specific terms, it should be understood that they have been used only for the purpose of describing the inventive concepts and not for limiting the scope of the inventive concepts as defined in the claims. Therefore, one with ordinary skill in the art will appreciate that various modifications and equivalent example embodiments are possible without departing from the scope of the inventive concepts. Therefore, the true scope of protection of the inventive concepts should be determined by the technical idea of the appended claims.

What is claimed is:

1. A transmitting device configured to connect to a receiving device via a channel, the transmitting device comprising:
   a transmitter connected to the channel via an output node, the transmitter configured to transmit, via the channel, a transmission signal to the receiving device, the transmitter having a transmission impedance associated therewith that is variable; and
   a monitoring device configured to detect a channel impedance of the channel and a receiving impedance of the receiving device by monitoring a voltage level of the output node, and to set the transmission impedance based on the channel impedance, the receiving impedance and a relaxed impedance matching constraint such that the transmission impedance causes a voltage level of the transmission signal arriving at the receiving device to increase within a range in which reflection of the transmission signal is not increased in the receiving device.

2. The transmitting device of claim 1, wherein the relaxed impedance matching constraint is $|\Gamma_{TX}\Gamma_{RX}e^{-2L\gamma(\omega)}| \ll 1$, wherein
   $\Gamma_{TX}$ is a reflection coefficient of the transmitting device,
   $\Gamma_{RX}$ is the reflection coefficient of the receiving device,
   L is a length of the channel, and $\gamma(\omega)$ is a propagation constant of the channel.

3. The transmitting device of claim 1, wherein the monitoring device is further configured to,
   detect a flight time associated with the transmission signal transmitted from the output node to the receiving device via the channel by monitoring the voltage level of the output node,
   detect the channel impedance based on the flight time, and
   calculate the transmission impedance by applying the receiving impedance and the channel impedance to the relaxed impedance matching constraint.

4. The transmitting device of claim 3, wherein the channel is a direct current (DC) coupled channel, and the monitoring device is configured to,
   sequentially detect the receiving impedance and the flight time,
   detect the channel impedance based on the flight time,
   calculate the transmission impedance by applying the receiving impedance and the channel impedance to the relaxed impedance matching constraint, and
   increase the transmission impedance to a maximum value, in response to the monitoring device not detecting the flight time.

5. The transmitting device of claim 3, wherein the channel is an alternating current (AC) coupled channel, and the monitoring device is configured to,
   detect the flight time,
   sequentially detect the channel impedance and the receiving impedance based on the flight time,
   calculate the transmission impedance by applying the channel impedance and receiving impedance to the relaxed impedance matching constraint, and
   increase the transmission impedance to a maximum value, in response to the monitoring device not detecting the flight time.

6. The transmitting device of claim 1, wherein
   the transmission signal includes a positive transmission signal and a negative transmission signal, and
   the output node includes a first output node and a second output node, and the transmitter is configured to output the positive transmission signal and the negative transmission signal via the first output node and the second output node, respectively.

7. The transmitting device of claim 6, wherein the transmitter comprises:
   a first variable transmission resistor connected between a power voltage terminal and the first output node;
   a second variable transmission resistor connected between the power voltage terminal and the second output node;
   a first transistor including a gate configured to receive an inverted data signal, the first transistor connected to the first output node, the inverted data signal being an inverted version of a data signal;

a second transistor including a gate configured to receive the data signal, the second transistor connected to the second output node; and a first current generator connected to the first transistor and the second transistor, the first current generator configured to provide a first current to the first transistor and the second transistor in a training mode to detect the transmission impedance.

8. The transmitting device of claim 7, wherein the transmitter further comprises:

a first multiplexer configured to output a delayed data signal as the first output signal according to a selection signal;

a second multiplexer configured to output an inverted delayed data signal in which the delayed data signal has been inverted as the second output signal according to the selection signal;

a third transistor connected to the first output node, the third transistor configured to receive the first output signal;

a fourth transistor connected to the second output node, the fourth transistor configured to receive the second output signal; and a second current generator connected to the third transistor and the fourth transistor, the second current generator configured to provide a second current to the third transistor and the fourth transistor in the training mode.

9. The transmitting device of claim 1, wherein the monitoring device comprises:

a slicer configured to generate a digital voltage by converting the voltage level of the output node to digital bits;

a snapshot block configured to generate a snapshot signal of m bits from the digital voltage; and a finite state machine configured to,
detect the channel impedance and the receiving impedance based on the snapshot signal of m bits, and
calculate the transmission impedance based on the channel impedance and receiving impedance,
wherein m is an integer of 2 or more.

10. The transmitting device of claim 9, wherein the output node includes a first output node and a second output node, and the transmitter is configured to output a positive transmission signal and a negative transmission signal via the first output node and the second output node, respectively, and the slicer includes, a pre-amplifier configured to generate, based on an amplifier current, a first input voltage corresponding to a voltage level of the first output node and a second input voltage corresponding to a voltage level of the second input node; and a comparator configured to generate the digital voltage based on the first input voltage and the second input voltage.

11. The transmitting device of claim 10, wherein the pre-amplifier includes, a first resistor and a second resistor each connected to a power voltage terminal;

a first transistor including a gate connected to the first output node, the first transistor connected in series to the first resistor;

a second transistor including a gate connected to the second output node, the second transistor connected in series to the second resistor; and a current generator connected to the first transistor and the second transistor, the current generator configured to provide the amplifier current to the first transistor and second transistor in a training mode to detect the transmission impedance.

12. The transmitting device of claim 10, wherein the comparator comprises:

a sense amplifier configured to generate a first sensing signal and a second sensing signal from the first input voltage and the second input voltage, respectively;

a clock gating circuit configured to,
receive an end signal and a clock signal, and
gate the clock signal provided to the sense amplifier when the end signal is activated in response to completion of setting the transmission impedance; and a latch configured to output the digital voltage from the first sensing signal and the second sensing signal.

13. The transmitting device of claim 1, wherein the transmitter and the monitoring device are integrated on a same ship.

14. The transmitting device of claim 1, wherein the monitoring device is a time domain reflectometer (TDR) monitoring device.

15. A receiving device configured to connect to a transmitting device via a channel, the receiving device comprising:

a receiver connected to the channel via an input node, the receiver configured to receive, via the channel, a receiving signal from the transmitting device, the receiver having a receiving impedance associated therewith that is variable; and a monitoring device configured to detect a channel impedance of the channel and a transmission impedance of the transmitting device by monitoring a voltage level of the input node, and to set the receiving impedance based on the channel impedance, the transmission impedance and a relaxed impedance matching constraint such that the transmission impedance causes the voltage level of the receiving signal arriving at the input node of the receiving device to increase within a range in which reflection of the receiving signal is not increased in the receiving device.

16. The receiving device of claim 15, wherein the receiver and the monitoring device are integrated on a same chip.

17. The receiving device of claim 16, wherein the monitoring device is an integrated circuit device including an eye monitoring circuit configured to monitor the voltage level of the input node.

18. A transmitter configured to connect to a receiver via a channel, the transmitter comprising:

a transmitting driver having a transmission impedance associated therewith that is adaptive to a channel impedance of the channel and a receiving impedance of the receiver; and an on-chip monitor configured to set the transmission impedance based on the channel impedance, the receiving impedance and a relaxed impedance matching constraint such that the transmission impedance causes a voltage level of the transmission signal arriving at the receiver to increase within a range in which reflection of the transmission signal is not increased in the receiver, wherein
the on-chip monitor and the transmitting driver are integrated on a same chip.

19. The transmitter of claim 18, wherein the relaxed impedance matching constraint is $|\Gamma_{TX}\Gamma_{RX}e^{-2L\gamma(\omega)}| \ll 1$, wherein $\Gamma_{TX}$ is a reflection coefficient of the transmitter, $\Gamma_{RX}$ is the reflection coefficient of the receiver, L is a length of the channel, and $\gamma(\omega)$ is a propagation constant of the channel.

* * * * *